US006784616B2

(12) United States Patent
Akiba

(10) Patent No.: US 6,784,616 B2
(45) Date of Patent: Aug. 31, 2004

(54) AC DRIVE TYPE PLASMA DISPLAY PANEL HAVING DISPLAY ELECTRODES ON FRONT AND BACK PLATES, AND IMAGE DISPLAY APPARATUS USING THE SAME

(75) Inventor: Yutaka Akiba, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 27 days.

(21) Appl. No.: 10/186,695

(22) Filed: Jul. 2, 2002

(65) Prior Publication Data

US 2002/0163304 A1 Nov. 7, 2002

Related U.S. Application Data

(63) Continuation of application No. 09/200,739, filed on Nov. 30, 1998, now Pat. No. 6,414,435.

(30) Foreign Application Priority Data

Dec. 1, 1997 (JP) .......................................... 09-329876
Feb. 27, 1998 (JP) .......................................... 10-046728

(51) Int. Cl.[7] ................................................ H01L 17/49
(52) U.S. Cl. ........................................ 313/584; 313/582
(58) Field of Search ................................ 313/582–587, 313/292, 491, 495; 315/169.4; 345/60

(56) References Cited

U.S. PATENT DOCUMENTS

| | | | | |
|---|---|---|---|---|
| 3,746,420 | A | 7/1973 | Baker et al. | 313/582 |
| 4,066,929 | A | 1/1978 | Okamoto et al. | |
| 5,264,758 | A | 11/1993 | Iijima et al. | |
| 5,589,731 | A | 12/1996 | Fahlen et al. | |
| 5,663,611 | A | 9/1997 | Seats et al. | 313/584 |
| 5,675,212 | A | 10/1997 | Schmid et al. | 313/292 |
| 5,754,003 | A | 5/1998 | Murai et al. | 313/582 |
| 5,818,168 | A | 10/1998 | Ushifusa et al. | 313/582 |
| 5,883,462 | A | 3/1999 | Ushifusa et al. | 313/292 |
| 6,049,165 | A | 4/2000 | Spindt et al. | 313/495 |

FOREIGN PATENT DOCUMENTS

| | | |
|---|---|---|
| DE | 2601925 | 7/1976 |
| EP | 0123496 | 10/1984 |
| EP | 0762461 | 3/1997 |
| JP | 3-152830 | 6/1991 |

(List continued on next page.)

OTHER PUBLICATIONS

*Patent Abstracts of Japan*, vol. 16, No. 392 (E–1251), Aug. 20, 1992, for Japanese reference 4–129131 published on Apr. 30, 1992.
*Patent Abstracts of Japan*, vol. 16, No. 492 (E–1278), Oct. 12, 1992, for Japanese reference 4–181633 published on Jun. 29, 1992.
*Patent Abstracts of Japan*, vol. 17, No. 549 (E–1443), Oct. 4, 1993, for Japanese reference 5–159706 published on Jun. 25, 1993.
*Patent Abstracts of Japan*, vol. 18, No. 221 (E–1540), Apr. 20, 1994, for Japanese reference 6–20608 published on Jan. 28, 1994.
*Patent Abstracts of Japan*, vol. 95, No. 4, Nay 31, 1995, for Japanese reference 7–29497 published on Jan. 31, 1995.
*Patent Abstracts of Japan*, vol. 97, No. 8, Aug. 29, 1997, for Japanese reference 9–106767 published on Apr. 22, 1997.
*Patent Abstracts of Japan*, vol. 97, No. 9, Sep. 30, 1997, for Japanese reference 9–129143 published on May 16, 1997.

*Primary Examiner*—Joseph Willams
(74) *Attorney, Agent, or Firm*—Antonelli, Terry, Stout & Kraus, LLP

(57) ABSTRACT

A plasma display panel includes a front plate, at least one electrode disposed on the front plate, a back plate opposing the front plate, the back plate being spaced apart from the front plate, at least one electrode disposed on the back plate, and a plurality of partition walls disposed between the front plate and the back plate. The partition walls divide a space between the front plate and the back plate into a plurality of display cells. Each of the partition walls has a plurality of projections opposing one of the front plate and the back plate. The projections are arranged such that the projections do not overlap the at least one electrode disposed on the one of the front plate and the back plate.

32 Claims, 21 Drawing Sheets

FOREIGN PATENT DOCUMENTS

| | | |
|---|---|---|
| JP | 3-205738 | 9/1991 |
| JP | 3-233832 | 10/1991 |
| JP | 4-19942 | 1/1992 |
| JP | 4-129131 | 4/1992 |
| JP | 4-147535 | 5/1992 |
| JP | 4-181633 | 6/1992 |
| JP | 4-272634 | 9/1992 |
| JP | 5-159706 | 6/1993 |
| JP | 5-190099 | 7/1993 |
| JP | 6-20608 | 1/1994 |
| JP | 7-29497 | 1/1995 |
| JP | 7-70288 | 7/1995 |
| JP | 7-192634 | 7/1995 |
| JP | 2532970 | 6/1996 |
| JP | 9-106767 | 4/1997 |
| JP | 9-129143 | 5/1997 |
| JP | 2741418 | 1/1998 |
| KR | 93-4994 | 6/1993 |
| WO | 91/06115 | 5/1991 |

I – I

XI—XI

XIV - XIV

XV-XV

XVI-XVI

AC DRIVE TYPE PLASMA DISPLAY PANEL HAVING DISPLAY ELECTRODES ON FRONT AND BACK PLATES, AND IMAGE DISPLAY APPARATUS USING THE SAME

CROSS-REFERENCE TO RELATED APPLICATIONS

This application is a continuation of application Ser. No. 09/200,739 filed on Nov. 30, 1998, now U.S. Pat. No. 6,414,435, the contents of which are hereby incorporated herein by reference in their entirety.

This application is related to application Ser. No. 10/187,175 filed on Jul. 2, 2002, which, like the present application, is a continuation of application Ser. No. 09/200,739.

BACKGROUND OF THE INVENTION

The present invention relates to a plasma display panel and image display apparatus using the same, which are used as an information processing terminal, for a flat-type or wall-hanging type television, or the like.

The gas discharge type display such as plasma display makes displaying by self-light emission, and thus it has wide field-of-view angle and provides a better easy-to-watch displaying characteristic. In addition, it can be produced to be thin and large-sized. The application of the plasma display has begun to the displays for information terminal equipment and high-definition television receivers. The plasma display can be roughly classified into DC drive type and AC drive type. Of these types, the AC drive type plasma display has developed to the extent that the brightness can be increased by the memory action of the dielectric layer covering the electrodes, and that its life span can be extended enough to bear practical use by forming a protective layer. The result is that the plasma display is now being put to practical use as a multi-purpose video monitor.

The AC drive type plasma display is generally composed of a front plate, a back plate, and a discharge space region that is formed between the front and back plates and that has a great number of cells partitioned by walls. The front plate has formed therein a plurality of pairs of display electrodes. The back plate has formed therein a plurality of address electrodes that are substantially perpendicular to these display electrodes. When a pulse voltage is applied between the address electrodes and display electrodes, an auxiliary discharge is caused in the respective cells formed by the front and back plates and the partition walls. Under this auxiliary discharge, a main discharge is caused by applying a pulse voltage between the display electrodes of the respective pairs of the front plate formed to oppose the respective cells. The ultraviolet light from the main discharge excites the phosphor to emit light. The light from the phosphor is passed through the front plate, thus displaying and light emission being made.

This conventional AC drive type plasma display made displaying and light emission by surface discharge between the display electrodes of each pair. An example of this conventional AC drive type plasma display is described in JP-A-5-190099.

SUMMARY OF THE INVENTION

A first object of the invention is to provide exactly a novel AC type plasma display panel with the light emission efficiency improved.

A second object of the invention is to provide an AC type plasma display panel with the discharge efficiency improved by producing positive columns.

A third object of the invention is to improve the discharge efficiency in the plasma display panel.

In order to achieve the first object in accordance with the invention, there is provided a plasma display panel having at least a back plate that has a plurality of address electrodes and a plurality of first display electrodes arranged to intersect with the address electrodes, and a front plate that has a plurality of second display electrodes arranged to oppose the plurality of first display electrodes so that discharge can be caused between the second electrode and the first display electrode addressed by use of the address electrodes.

Since the first and second display electrodes are opposed to each other, or employ an opposite electrode structure, the gap length between the first and second display electrodes can be made substantially constant in the display electrode plane. In addition, since the display electrodes of each pair can be respectively formed on the front and back plates for each electrode area to be wide, a stable discharge phenomenon can be caused. In other words, even if wall charge is generated between both the display electrodes, the discharge current can be kept stable (current density maintained constant) since the gap length in the display electrode plane is constant. Moreover, since the electrode area can be made large, the light emission duty can be increased, and thus the light emission efficiency is large enough.

In addition, since the display electrodes employ the opposite electrode structure, the wiring resistance of the second display electrodes formed by transparent electrodes and opaque electrodes (bus electrode) can be easily decreased since each electrode width can be increased in a plane as described above. Similarly, since only the first display electrodes are formed on the back plate, the electrode width can be made wider than those in the surface discharge type, and thus the wiring resistance of the electrodes can be much decreased. Thus, since the wiring resistance can be remarkably reduced, low consumption power can be achieved, leading to high light emission efficiency. Also, since the voltage drop on the driven display electrodes can be remarkably reduced, the operation margin can be increased.

In addition, since the display electrodes employ the opposite electrode structure, partition walls of high aspect ratio can be used, and the partition wall area on which phosphor is coated can be increased to raise the visible light taking out efficiency. In other words, the light emission efficiency of the panel can be improved.

Moreover, in the above structure, if a plurality of first display electrodes are respectively inherent electrodes (Y electrodes), and if a plurality of second display electrodes are a common electrode (X electrode) to those electrodes, the second display electrode can be formed by a single plane electrode to cover the entire surface of the panel. By use of the single plane electrode to cover all panel, it is possible not only to decrease the resistance of the second display electrodes but also to remove the highly precise etching process used so far for making transparent electrodes of a display electrode pattern.

Forming the second display electrodes in a single plane shape makes electric charge to easily move to other display cells, but the partition walls formed in a lattice shape to surround the display cells can suppress the charge movement, and thus prevent erroneous discharge in the other display cells.

Moreover, if the second display electrodes are formed by a transparent plane electrode and a bus electrode deposited thereon, and if the bus electrode is formed in a lattice shape to overlap the lattice-shaped partition walls, the resistance of the second display electrodes can be decreased without decreasing the opening rate as compared with the structure having the line-shaped bus electrode. In other words, if the opaque bus electrode as bus electrode is formed to match the shape of the partition walls of the display cells, the opening rate of the display cells can be remarkably increased to improve the brightness since it does not depend on the shape and size of the opaque electrode.

In addition, if the transparent electrode pattern of the second display electrodes is formed similar to the line-shaped electrode pattern of the first display electrode (opaque electrode), the stability of the repetitive discharge characteristic can be much improved against the generation of the wall charge. Both the display electrodes at this time are arranged parallel or perpendicular to each other. Since the bus electrode formed on the transparent electrode is formed to overlap on the lattice-shaped partition walls, the resistance of the display electrodes can be reduced, the opening rate of the display cells can be improved, and the capacitance between the electrodes can be decreased (openings are made up by forming a line pattern, reducing the electrode area). Particularly, since the effect of the bus electrode shape is little, this feature is advantageous to the highly minute structure of the panel.

In order to achieve the second object in accordance with the invention, there is provided a plasma display panel having at least a back plate that has a plurality of address electrodes and a plurality of first display electrodes arranged to intersect with the address electrodes, and a front plate that has a plurality of second display electrodes arranged to oppose the plurality of first display electrodes so that discharge with a positive column formed is caused between the second display electrode and the first display electrode addressed by use of the address electrodes.

Thus, since the display electrodes employ the opposite electrode structure, the distance between the first and second display electrodes necessary to make the positive column can be assured even if the size of the discharging cells is limited because of the highly minute structure of the panel. Therefore, since the positive column is generated by the above structure, the discharge efficiency can be increased as compared with the negative glow. The discharge efficiency is the amount of ultraviolet light generated per unit electric power. The ultraviolet light rays excite the phosphor to emit visible light. Here, the term, positive column, is one of the light emission states in the normal glow mode of glow discharge. In other words, although cathode dark space, negative glow, Faraday dark space, and positive column are caused in this order in the direction from the cathode to anode, display light emission operation is performed by chiefly using the positive column to radiate ultraviolet rays. This is because the discharge efficiency of the positive column is higher than the negative glow. In this case, a constant-intensity field is produced in the axis direction of the positive column. Since this field strength is determined by the energy which the electrons gain per unit length in the wall surface direction of the display discharge cells, and the energy lost by elastic collision or the like, if the diffusion to partition walls is suppressed as a fluorescent light, the discharge light emission characteristic of the positive column depends on the length of the discharge cells in the wall surface direction, but does not depend on the gap length between the opposite electrodes. Therefore, if even the gap length enough to stabilize the positive column can be assured, more increasing the gap length will not cause a larger field strength on the neighborhood of the partition walls, and the discharge maintaining current (discharge current density) for maintaining normal glow discharge can be fully reduced.

However, when the cell size or tube diameter of the panel becomes small enough, the energy loss due to the diffusion to partition walls cannot be neglected. In order to solve such difficulty, a constant bias voltage is applied to the metal partition walls that are arranged between the front and back plates and have the surface insulated. Thus, the electric field intensity (potential difference) in the wall surface direction which is necessary for the formed positive column can be stably and efficiently maintained through the ion sheath formed near the surface of the insulating (dielectric) layer, thereby generating the positive column to much improve the discharge efficiency.

The discharge maintaining current has been increased so far in order to make the positive column stable, thus the current density exceeding a constant level. Therefore, ultraviolet light is saturated except for the stability of discharge, thus limiting the improvement of discharge efficiency to some extent. If a bias voltage is applied to the metal partition walls to produce a wall voltage (wall charge) on the dielectric layer of the metal surface, the charged particles are suppressed from being neutralized, and the excessive energy loss due to the diffusion to partition walls is decreased. Thus, the discharge can be maintained stable even by decreasing the discharge maintaining current (current density). Therefore, the amount of charge necessary for maintaining the discharge (the minimum current necessary for maintaining the discharge) can be assured without saturating the ultraviolet light, and the discharge efficiency can be improved.

In addition, the metal sheets with the surfaces insulated are laminated to form a plate for this metal partition walls. If a bias voltage is applied to at least one of the metal sheets, the metal sheets each covered with an insulating (dielectric) layer are self-biased therebetween so that an electric field intensity (potential difference) can be generated in the axial direction. Consequently, the electric field intensity (potential difference) necessary for the formed positive column can be generated effectively and stably as compared with the single metal plate. Since the stable positive column can be produced in this way, the discharge maintaining current density for the normal glow discharge can be fully reduced. Thus, the positive column can be produced under the condition that the ultraviolet light rays are not saturated, and the discharge efficiency can be maximized.

Although the opposite electrode structure described so far has difficulty in the driving operation, increasing the gap length between the opposite X, Y display electrodes will increase the firing potential Vo which depends on the gap length, and the field crosstalk and charge crosstalk which affect the adjacent cells, use of metal partition walls with the sides covered with an insulating material and making the potential appropriate by applying a bias voltage as described above can reduce the gap length between the X, Y display electrodes effectively (increase the field strength between the electrodes), and the shield between the adjacent cells can prevent the field from being leaked and the associated unnecessary charge from being generated.

More specifically, since the effective gap length between the first and second display electrodes can be reduced by this metal partition wall, the firing potential Vo, or the operating point voltage at the first discharge light emission time can be reduced.

A load straight line (load resistance, current limiting resistance) is used to control the discharge maintaining current at the operating point and make the discharge efficiency appropriate. This operating point is given by the intersection between the load straight line and the current voltage characteristic curve (I–V characteristic curve) of the cells themselves. Since the I–V characteristic of the cells themselves suppresses the diffusion to partition walls according to the invention, the low current region (normal glow discharge region) is expanded. Therefore, the current at the operating point which is set by the load straight line can be reduced more stably by about one place or above than by means.

Since the wall voltage is generated on the display electrode in the cell structure of AC drive type, it affects the normal glow voltage Vn. This normal glow voltage Vn is chiefly given by the cathode drop voltage Vc or the potential of positive column in the axial direction (the product of the electric field strength E in the axial direction and the length 1 substantially equal to the gap between the electrodes). When the positive column is produced by AC type drive, the wall voltage can be used at the discharge start time as compared with the DC type drive, and thus the normal glow voltage Vn, or the cathode drop voltage Vc can be apparently reduced. Therefore, the AC type drive is able to apparently decrease the operating point voltage (normal glow voltage Vn) by the value corresponding to the wall voltage with respect to the I–V characteristic of the cell themselves since the wall voltage is generated.

Thus, the normal glow discharge region of the I–V characteristic is made to meet low current and low voltage by suppressing the diffusion to partition walls of the positive column under the AC type drive. Accordingly, while stable discharge (positive column) is being maintained (generated), the operating point current and voltage according to the load straight line can be reduced at a time. Since the current and voltage at the operating point are low, the consumption power can be reduced, and also the discharge maintaining current (current density) can be made appropriate. Thus, the discharge efficiency can be remarkably improved.

In the plasma display panel having a great number of display cells formed by the front and back plates that have electrodes connected to a drive circuit system, and the partition walls held between those plates, the partition walls are formed by a single metal sheet with the surface insulated or by laminating a plurality of metal sheets with the surfaces insulated. At least one of the sheets of the partition walls is connected to the drive circuit system in order to be biased by a bias voltage. The electrodes and the partition walls having at least one of the sheets to which a bias voltage is applied are respectively connected to proper load resistances.

Thus, address discharge is caused between the A, Y electrodes within a selected display cell so that wall charge is generated on the Y electrode. Preliminary discharge is caused between the Y electrode with wall charge generated and the metal walls supplied with a bias voltage and serving as electrodes so as to produce priming particles. The generated priming particles can reduce the firing potential Vox-y between the X, Y display electrodes. The discharge can be stably maintained under the discharge maintaining voltage that is reduced by the amount corresponding to the wall voltage.

Moreover, this metal partition wall structure is able to solve the light penetration phenomenon (light crosstalk) appearing in the display cells surrounded by dielectric partition walls.

Therefore, this opposite electrode structure is constructed by use of the metal partition walls considering process and assembly, firing potential, and various types of crosstalk.

In addition, when the metal partition walls are used, the capacitance between the opposite X, Y display electrodes is increased, and thus the consumption power is increased in proportion to the $CV^2$ per pulse. However, if the metal partition walls are made in contact with or connected to the front plate or back plate through a plurality of projections formed on the metal partition wall side or front or back plate side, that increase can be suppressed.

More specifically, in the plasma display panel having a plurality of display cells formed by the front and back plates that have electrodes connected to a drive circuit system, and the partition walls held therebetween, a plurality of projections are provided on the surfaces of the partition walls opposed to the front or back plate and arranged not to be made in contact with the electrodes formed on the front or back plate, thereby making it possible to suppress the capacitance from increasing due to the metal partition walls. In addition, when a single plane electrode is formed on the front plate as a common display electrode to the plurality of display cells, openings should be locally provided in the plane electrode so that the projections on the partition walls cannot be made in contact with the plane electrode. Thus, the contact area or connection area between the metal partition walls and the front or back plate can be reduced, resulting in the decrease of the capacitance between the X, Y electrodes. In this case, it is preferable that the projections be arranged not to overlap on the electrodes formed on the front or back plate. Moreover, since the electrode surface is required to have an insulating layer improved in its dielectric strength, it is preferable that when the metal partition walls are formed by laminating a plurality of metal sheets with the surfaces insulated, all the metal sheets not be used as (driving) electrodes to which a bias voltage is applied. Even if the metal partition walls are applied to the conventional surface discharge type plasma display panel, the capacitance between the address electrodes and display electrodes arranged to oppose can be suppressed from increasing.

Also, in the cross structure of address electrodes and display electrodes Y mentioned so far, if the firing potential Voa-y is tried to decrease by reducing the thickness of the insulating layer between the address electrode A and display electrode Y, the dielectric strength of the insulating layer is reduced, degrading the reliability of the panel or the consumption power is increased with the increase of the inter-electrode capacitance in proportion to the $CV^2$ per pulse. On the other hand, in the display cell structure in which the front plate has on an insulating substrate a first insulating layer, A electrodes, a second insulating layer, Y electrodes, and a third insulating layer formed in this order, a fourth insulating layer of a single layer or multilayer structure (that prevents defects such as pinholes from being caused) for the electrodes Y is deposited between the second insulating layer and the Y electrodes.

Moreover, in the cross structure of the address electrodes A and display electrodes Y, if the capacitance between the electrodes and the dielectric strength of the insulating layer are respectively tried to decrease and increase by contrarily increasing the thickness of the insulating layer between the address electrodes A and display electrodes Y, the firing potential Voa-y is increased, and the drive IC is required to have high dielectric strength. In the display cell structure in which the back plate has, on an insulating substrate, a first insulating layer, A electrodes, a second insulating layer, Y electrodes, and a third insulating layer formed in this order, the third insulating layer covers the Y electrodes and their surrounding area, but does not cover at least part of the second insulating layer.

The present invention is based on the fundamental principle of operation found so far through our research to achieve the third object.

The principle uses the means for effectively and simultaneously establishing the high field region in the cathode dark space and the equipotential region in the positive column considering the glow discharge maintaining conditions as will be described below.

Metal partition walls with surfaces insulated and of high aspect ratio are arranged between the opposite display electrodes. A voltage substantially equal to that at the anode electrode is applied to the metal partition walls, causing a wall voltage Vw (wall charge $Qw=C\cdot Vw_0$, where C is the capacitance of the dielectric on the surface of the metal partition walls) on the dielectric layer on the surface of the metal partition walls. The wall charge used to generate the wall voltage Vw is always anode potential considering the fact that the equipotential region of the positive column is substantially equal to the anode potential since this charge is required not to consume or not to exchange during the repetitive discharge. In order to make the drive circuit for the metal partition walls unnecessary, and to provide ground within the panel structure to thereby drive stably, the anode electrode is grounded. The stable wall voltage Vw is generated by self-balance, and the diffusion of charged particles to the partition walls (energy loss) due to the reduction of the cell size (tube diameter) is much suppressed, resulting in effective production of plasma (positive column). In addition, since the wall voltage Vq is generated on the display electrodes by the AC type drive in addition to the suppression of the diffusion to partition walls, the I–V characteristic (normal glow discharge region) of the cell themselves is changed to low current, low voltage region, and the current and voltage at the operating point according to the load line can be remarkably reduced. Thus, the discharge can be maintained stable even under the minimum necessary current density where the saturation of ultraviolet light (saturation of brightness) is not caused.

When the diffusion to partition walls is not fully suppressed, the discharge cannot be stably maintained even if the positive column can be produced. Therefore, the discharge maintaining current is required to increase, and thus the energy loss is increased, limiting the improvement of discharge efficiency to some extent.

By use of the above principle, it is possible to make the discharge maintaining current appropriate, and stably maintain the discharge under the minimum necessary current density at which saturation of ultraviolet light (saturation of brightness) is not caused. Thus, the discharge efficiency can be improved by one order of magnitude, or one place or above.

Moreover, the invention can be applied to other electronic apparatus for generating the positive column by using glow discharge than the plasma display panel. At least, the discharge efficiency, or ultraviolet light generation efficiency can be improved.

DESCRIPTION OF THE PREFERRED EMBODIMENTS

Some embodiments of the invention will be described with reference to the accompanying drawings.

Figure 1:
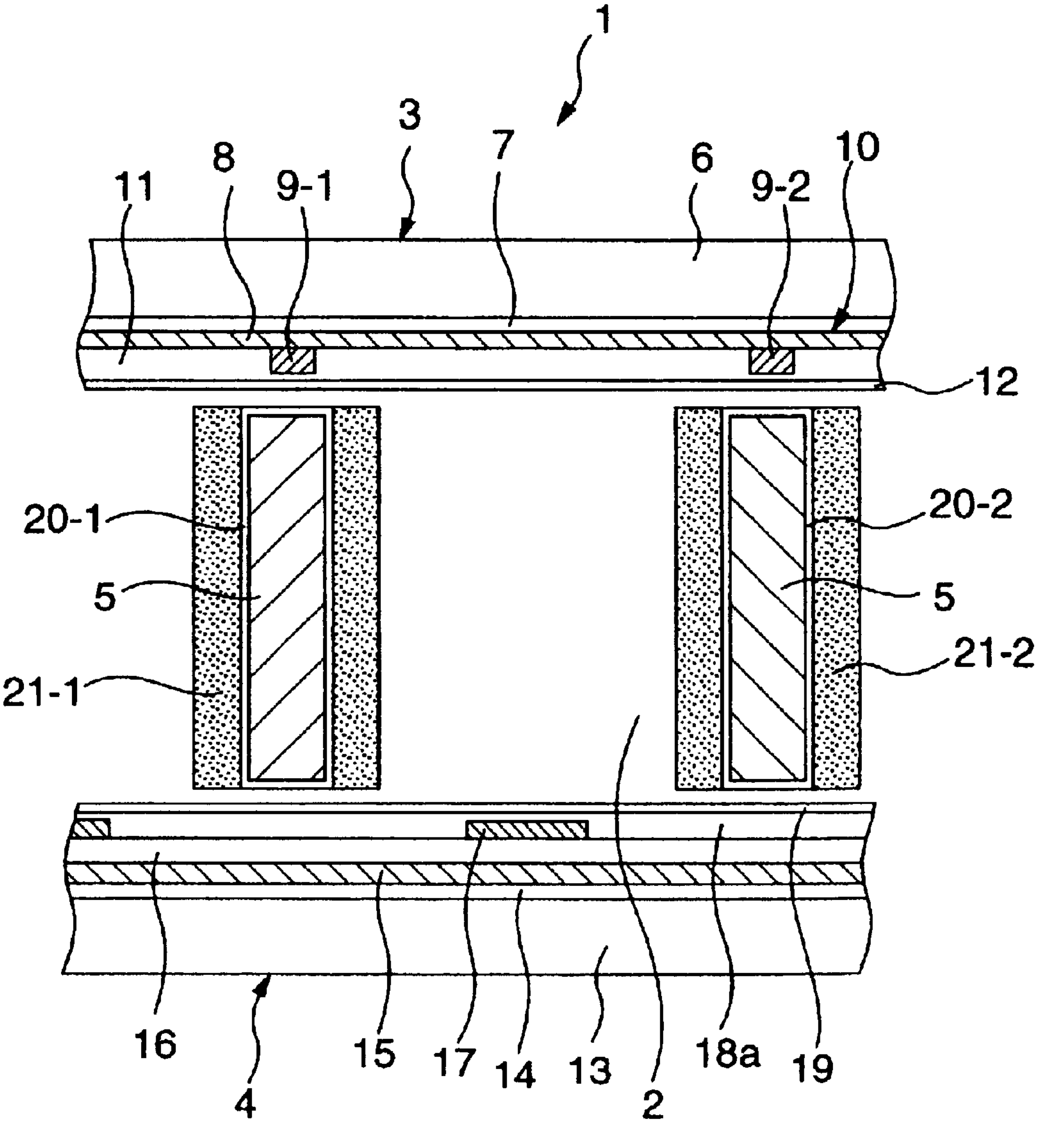
FIG. 1 is a cross-sectional diagram indicated by the arrow I—I on FIG. 3, showing the display cell structure of a plasma display panel according to the invention.
Figure 3:
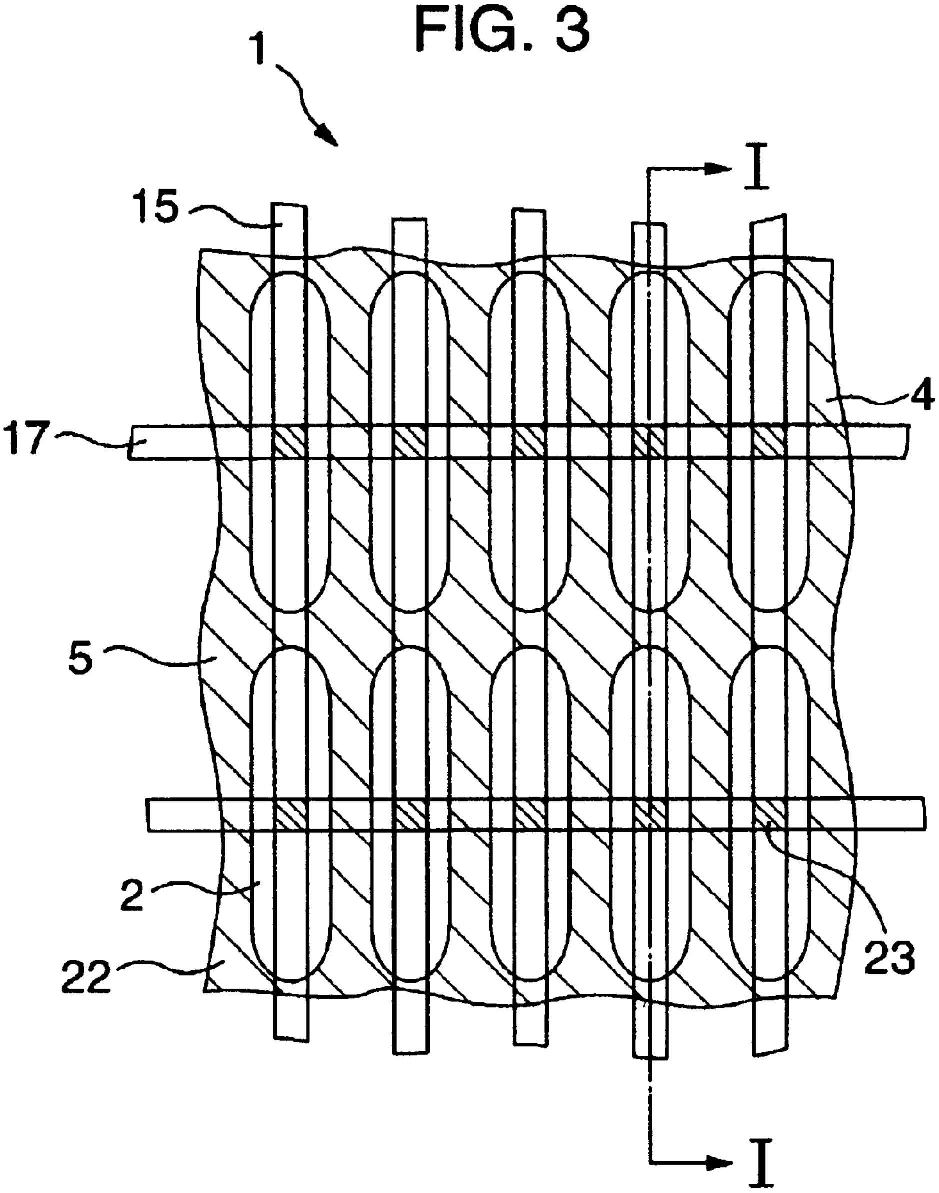
FIG. 3 is a plan view showing the display cell structure of a plasma display panel according to the invention.

FIG. 1 is a cross-sectional view indicated by the arrow I—I on FIG. 3, showing the structure of the display cell 2 of the plasma display panel 1 according to one embodiment of the invention.

The plasma display panel 1 takes a three-piece structure composed of the front plate 3, back plate 4 and metal partition walls 5.

The front plate 3 has formed on a transparent glass substrate 6, a transparent underlayer film 7 of $SiO_2$, a transparent electrode 8 of ITO film, and a bus electrodes 9 (9-1, 9-2) of small resistivity ρ, in turn. The bus electrodes 9 and the transparent electrode 8 constitute a plane electrode, forming the common display electrode (X electrode) 10 as the electrode of the display cells 2. The bus electrode 9 is usually formed by an opaque thick-film conductor of an Ag-based material, but can be formed by a metal laminate film of Cr/Cu/Cr to a thickness of about several micrometers μm. In addition, the bus electrode 9 is sometimes formed by a black conductive material in order to serve both as black matrix and as itself. On the transparent electrode 8 and bus electrodes 9, there are formed a dielectric layer 11 of a thick film for storing the wall electric charge (a thin film is sometimes used), and then a protective layer 12 of MgO film that has a large secondary electron emission coefficient and excellent in its resistance to sputtering. The protective layer 12 is sometimes formed to be thick from the process and cost point of view. The material for the protective film 12 except MgO may be BaO, $Y_2O_3$, ZnO, $RuO_2$ which are effective to reduce the cathode drop voltage Vc.

The back plate 4 has formed on a glass substrate 13 an underlayer 14 of $SiO_2$, the address electrode (A electrode) 15 of a thick film conductor made of an Ag-based material or the like, the thick film dielectric layer 16, the display electrode (Y electrode) 17 of a thick film conductor made of an Ag-based material or the like, a thick film dielectric layer 18*a*, and then a protective layer 19 of MgO film, in turn. Although the use of thick film conductors for the A electrode 15 and Y electrode 17 can make the process simple and the cost be decreased, a metal laminate of Cr/Cu/Cr may be used for those electrodes.

The metal partition walls 5 are formed left when an Fe—Ni-based thin plate of which the thermal expansion coefficient is equal to that of the glass substrate 6, 13 is perforated by etching or the like. Also, an insulating oxide film 20 (20-1, 20-2) is formed on the surfaces of the walls. The oxide film 20 can be replaced by an electrodeposited glass insulating film or an ion-plated aluminum oxide film in order for the insulating film to be improved in the voltage-resistant characteristic. The surfaces of the metal partition walls 5, or the inner walls of the holes are further covered with a phosphor 21 (21-1, 21-2) of a substantially uniform thickness. The phosphor 21 is deposited before the metal partition walls 5 are connected to the back plate 4, but may be formed after the connection. As to the metal partition walls 5, if a plurality of laminae as metal sheets processed for insulation are stacked and perforated, holes of a high aspect ratio can be formed with ease, and the capacitance between sheets and capacitance between display electrodes can be reduced.

The number of electrodes provided around the display cells 2 is three. The X electrode 10 and Y electrode 17 are opposed to each other with the metal partition walls 5 having the insulating film on the surfaces being interposed therebetween. In addition, the A electrode 15 and the Y electrode 17 are perpendicular to each other with the dielectric layer 16 interposed therebetween. Particularly when the metal partition walls 5 have no problem in operation under the electrode structure which will be described later or under the presence of the wiring capacitance between the electrodes which acts as a load capacitance due to a power recovery circuit, it is not necessary that the oxide film 20 formed on the surfaces of the metal partition walls 5 have perfect insulation (the reduction of the dielectric strength and reduction of surface resistance due to the coating of phosphor or the like can be permitted to some extent) as long as the dielectric layers 11, 18*a* formed on the surfaces of the X electrode 10 and Y electrode 17 have a sufficiently high dielectric strength. Moreover, the process for producing the metal partition walls 5 can be simplified, and the cost can be reduced.

Figure 2:
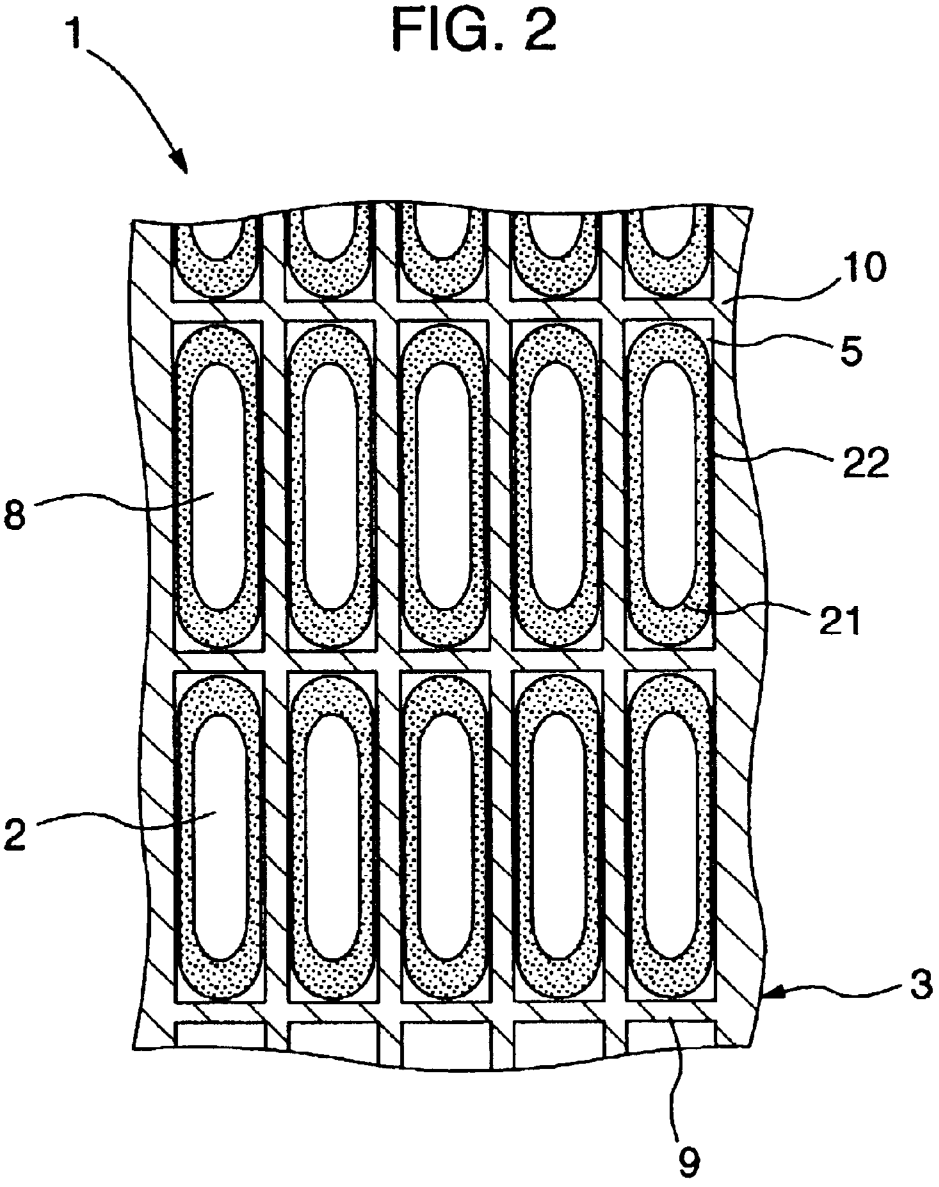
FIG. 2 is a plan view showing the display cell structure of a plasma display panel according to the invention.

FIG. 2 is a plan view of the plasma display panel 1 viewing from the front plate 3 side.

The bus electrode 9 is formed in a lattice shape to match the hole shape 22 of the openings of the display cells 2 that is determined by the metal partition walls 5 so that the opening areas of the display cells 2 are not affected by the bus electrode pattern. The phosphor 21 is formed on the inner side of the hole shape 22, and since the longitudinal thickness of the display cell is twice or more larger than the transverse thickness, the light emission efficiency is increased the more. Since the transparent electrode 8 of ITO film is formed in a plane structure, and since the bus electrode 9 is formed in a lattice shape, the electrode resistance of the X electrode 10 is reduced so that the consumption power can be remarkably reduced, and that the driving voltage can be prevented from being reduced due to the discharge current flow (improved in operation margin).

FIG. 3 is a plan view of the plasma display panel 1 viewing from the back plate 4 side.

The A electrodes 15 and the Y electrodes 17 intersect with each other at the centers of the hole shapes 22 of the metal partition walls 5, or at intersections 23. The Y electrodes 17 are made wide in the longitudinal direction of the hole shape 22 so that the electrode resistance of the Y electrodes 17 can be similarly reduced, resulting in the reduction of consumption power as aforementioned about the X electrode 10.

The structure of the intersections 23 determines the firing potential V0 and dielectric strength Vd between the A electrode 15 and the Y electrode 17, and a load capacitance Clay. As will be understood from the cross-sectional view of FIG. 1 and the plan view of FIG. 3, the thickness of the dielectric layer 16 (shown in FIG. 1) is well selected under a constant condition since the reduction of firing potential V0 and the increase of dielectric strength Vd cannot be satisfied at a time or since the reduction of firing potential V0 and the decrease of load capacitance Clay cannot be fulfilled at the same time. In order to satisfy only the increase of the dielectric strength Vd and the decrease of load capacitance Clay, it is necessary to increase the thickness of the dielectric layer 16 (shown in FIG. 1). In order to meet the reduction of firing potential V0 in addition to the above conditions, it is necessary that the thickness of the dielectric layer 16 (shown in FIG. 1) be kept constant, and that the area of the intersection 23, or the widths of the electrodes be decreased.

Figure 4:
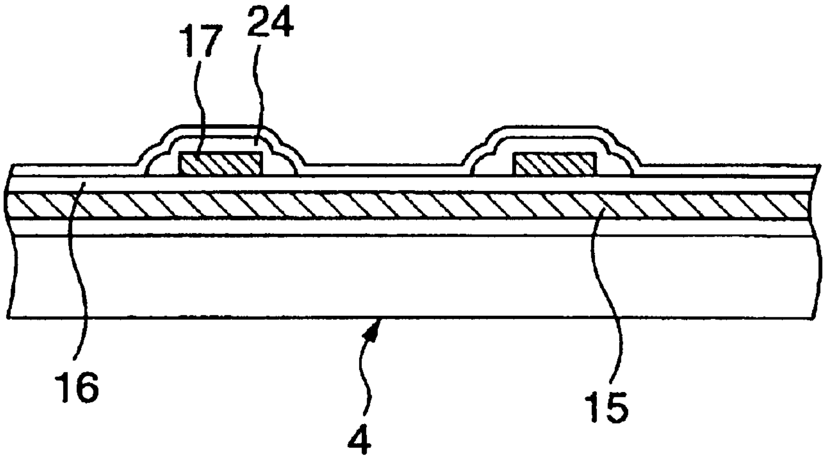
FIG. 4 is a cross-sectional view showing the electrode structure of a plasma display panel according to the invention.

FIG. 4 shows another embodiment of the invention, showing another back plate 4 instead of showing in FIG. 1.

A dielectric layer 24 covers the Y electrode 17 and its surrounding area of the dielectric layer 16, but does not cover the other area of the dielectric layer 16 as illustrated so that the portion not covered is left within the display cell shown in FIG. 1. Since the dielectric layer 24 replaces the dielectric layer 18*a* of the two-layer structure of dielectric layers 16, 18*a* shown in FIG. 1 relative to the A electrode 15, the thickness of the dielectric layer 18*a* between the A electrode 15 and the Y electrode 17 can be removed, with the result that the firing potential Vo can be reduced.

Figure 5:
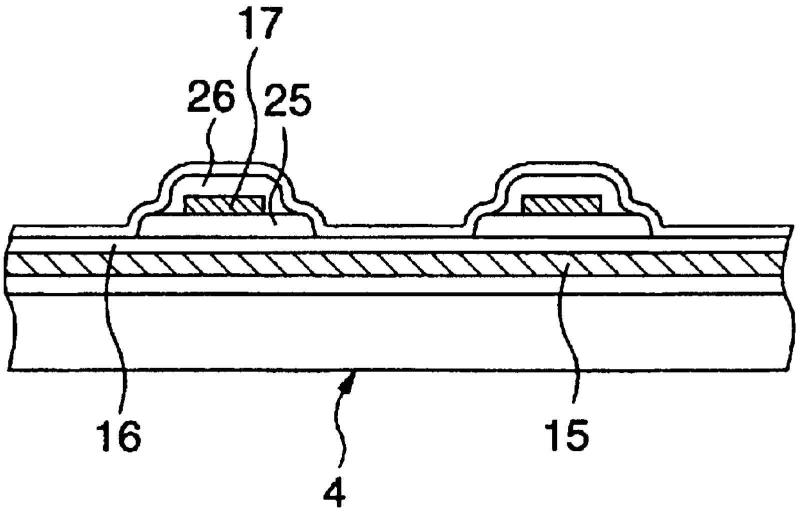
FIG. 5 is a cross-sectional view showing the electrode structure of a plasma display panel according to the invention.

FIG. 5 shows still another embodiment of the invention, showing another back plate 4 instead of showing in FIG. 1.

Another dielectric layer 25 is formed as an underlayer underlying the Y electrode 17 is deposited between the dielectric layer 16 and the Y electrode 17 formed thereon, and that portion of dielectric layer 16 which is not covered with the dielectric layer 25 is left within the display cell 2 shown in FIG. 1. A dielectric layer 26 deposited over the Y electrode 17 covers the surrounding area of the Y electrode 17 and formed on the dielectric layer 25. Particularly when the dielectric layer 26 is formed on the dielectric layer 16 in addition to the dielectric layer 25, that portion of dielectric layer 16 which is not covered with the dielectric layer is left within the display cell 2 shown in FIG. 1.

The structure of these two dielectric layers has the effect to remove the increment of the firing potential V0 between the A electrode 15 and the Y electrode 17 which firing potential is forced to increase due to the thickness of the dielectric layers 25, 26, and to increase the firing potential Vd and decrease the load capacitance Clay due to the thickness of the dielectric layer 25 inserted between the A electrode 15 and the Y electrode 17. The increase of dielectric strength Vd and the decrease of load capacitance Clay can be easily achieved by decreasing the area of the intersection areas 23 (FIG. 3) and by forming the dielectric layer 25 in a multilayer to increase the thickness. The reduction of firing potential Vo can be easily realized by decreasing the thickness of the dielectric layers 16, 26. Therefore, this structure can increase the dielectric strength Vd and also reduce the load capacitance Clay without increasing the firing potential Vo between the A electrode 15 and the Y electrode 17. Thus, the newly inserted dielectric layer 25 and the dielectric layer 26 added with a new structure condition can expand the freedom of structure design for the firing potential Vo, dielectric strength Vd, and load capacitance Clay.

Figure 6:
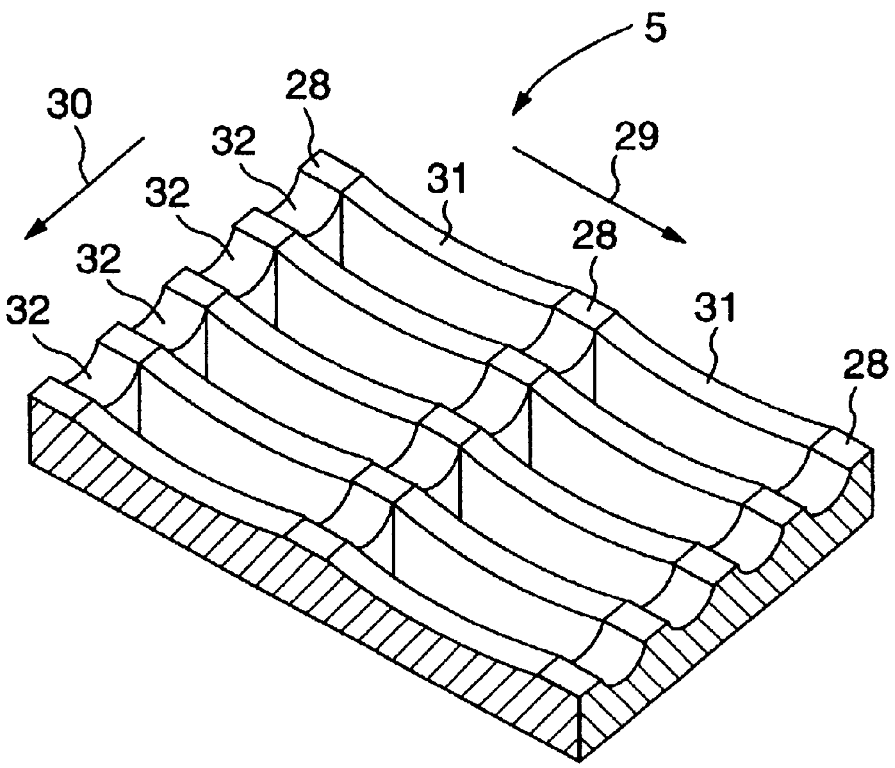
FIG. 6 is a perspective view showing the metal partition wall structure of a plasma display panel according to the invention.

FIG. 6 shows still another embodiment of the invention, or is a perspective view showing the structure of metal partition walls 5.

The metal partition walls 5 each have a plurality of projections 28 provided to oppose the back plate 4 in FIGS. 1 through 5 in order to reduce the contact area to the back plate 4, specify the contact positions, and provide vents, or openings for the flow of discharge gas into or out of the display cells 2. These projections are formed to fit the hole shape 22 of the display cells 2 shown in FIG. 3. In addition, curved surfaces, or recesses 31, 32 are formed by etching or the like. The shapes of recesses 31, 32 are sometimes locally provided relative to the size of the display cell 2 in order to prevent the electric crosstalk.

Figure 7:
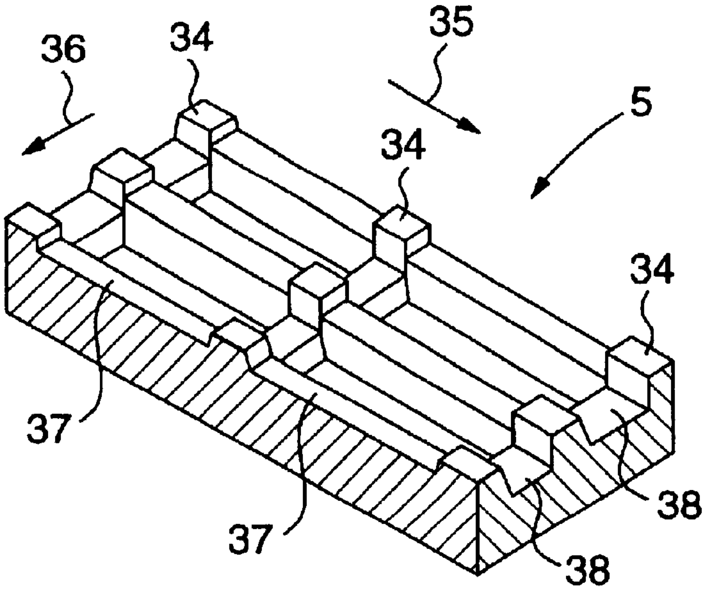
FIG. 7 is a perspective view showing the metal partition wall of a plasma display panel according to the invention.

FIG. 7 shows still further embodiment of the invention, or is a perspective view showing the structure of metal partition walls 5.

The metal partition walls 5 each similarly have a plurality of projections 34 provided to oppose the back plate 4 in FIGS. 1 through 5 in order to increase the contact area relative to the back plate 4, specify the contact positions, and form vents for the flow of discharge gas into or out of the display cells shown in FIG. 3. The projections are also formed to fit the hole shape 22 of the display cells shown in FIG. 3. Also, rectangular recesses 37, 38 with different depths are provided in the longitudinal direction 35 and in the transverse direction 36. The recesses are formed by two-step etching. The depths of the recesses 37, 38 are made different so that the recess 37 in the more restrict longitudinal direction 35 is shallower than the recess 38 in the transverse direction 36 in order to prevent the electric crosstalk between the adjacent display cells 2 shown in FIG. 3. In addition, the depths of the recesses 37, 38 are made constant in a rectangular shape as compared with the structure shown in FIG. 6. The projections 34 are usually formed by processing the metal itself of the metal partition walls 5, but may be made by providing dielectric posts, or bumps on the surface of the perforated metal sheet. Glass projections may be formed as projections 34 on the lattice-shaped metal surface by utilizing the surface tension at the time of firing. Thus, the capacitance between the electrodes can be further reduced by these projections.

Figure 8:
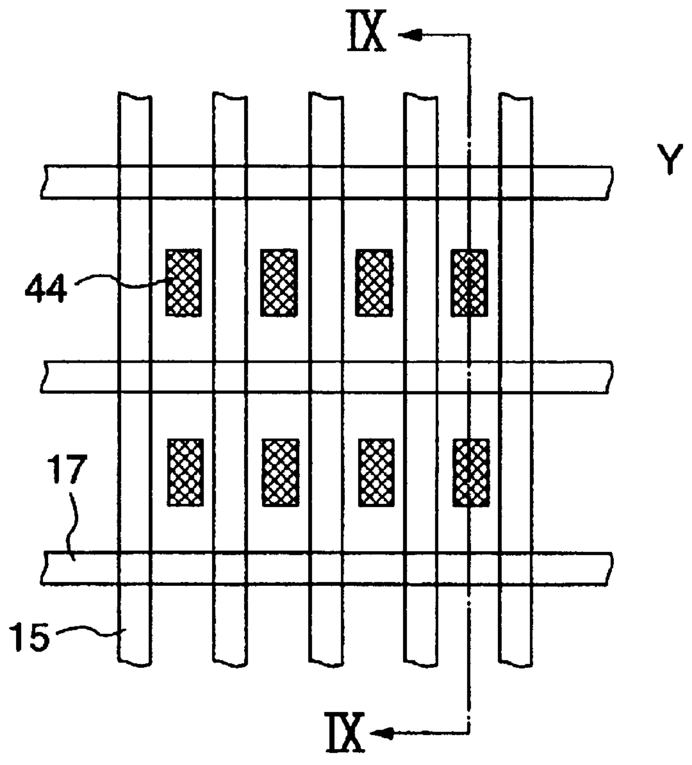
FIG. 8 is a plan view showing the assembly structure of partition walls and electrodes of a plasma display panel according to the invention.
Figure 9:
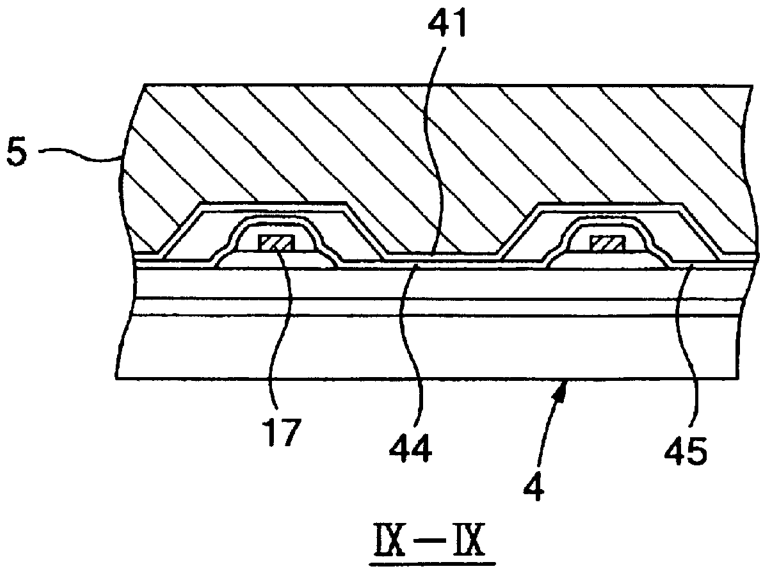
FIG. 9 is a cross-sectional view indicated by the arrow IX—IX on FIG. 8, showing the assembly structure of partition walls and electrodes of a plasma display panel according to the invention.

FIGS. 8 and 9 show still further embodiment of the invention, or a plan view and cross-sectional view of the structure in which metal partition walls 5 are provided on a back plate 4. FIG. 9 is a cross-sectional view taken along the arrow IX—IX in FIG. 8.

A projection 41 formed on the metal partition wall 5 shown in FIG. 9 is made in contact with an MgO film 45 of the back plate 4 at each of contact areas 44 that are regularly arranged so as not to overlap on A electrodes 15 and Y electrodes 17 on the plane shown in FIG. 8. Thus, the capacitance coupling between the metal partition wall 5 and the A, Y electrode 15, 17 can be alleviated to a great extent. In other words, load capacitances Clxy, Clxa are reduced between the common display electrode 10 shown in FIG. 1 and the display electrode 17, and between the common display electrode 10 and the address electrode 15. Particularly, if the projections 41 are made of dielectric posts, the capacitance can be much more reduced.

The present invention is able to fundamentally attain the reduction of the load capacitance between the display electrodes which was difficult in the face discharge type. In addition, the invention can reduce a coupling capacitance Cla-m-y between the A electrode 15 and Y electrode 17 on the back plate 4 with the metal partition walls 5 provided. Thus, the metal partition wall structure replacing the dielectric partition wall can suppress the capacitance coupling between the electrodes, and easily reduce the load capacitance Clxy.

Figure 10:
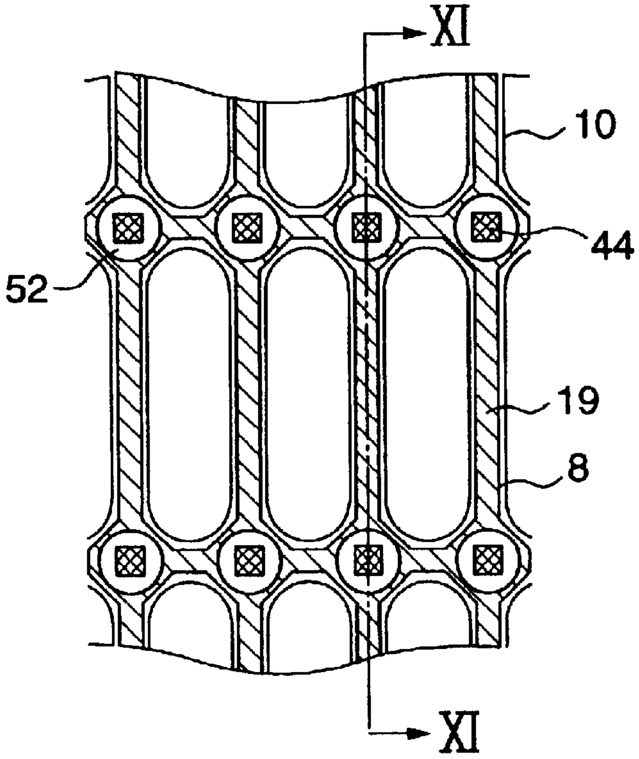
FIG. 10 is a plan view showing the assembly structure of partition walls and electrodes of a plasma display panel according to the invention.
Figure 11:
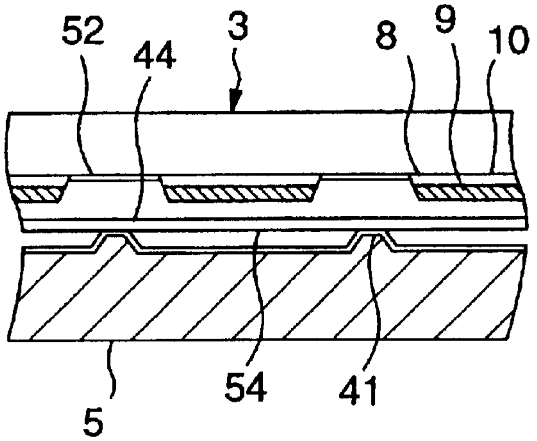
FIG. 11 is a cross-sectional view indicated by the arrow XI—XI on FIG. 10, showing the assembly structure of partition walls and electrodes of a plasma display panel according to the invention.

FIGS. 10 and 11 show still another embodiment of the invention, or a plan view and cross-sectional view of the structure in which metal partition walls 5 are provided on the front plate 3. FIG. 11 is a cross-sectional view taken along the arrow XI—XI in FIG. 10.

The projections 41 formed on the metal partition wall 5 shown in FIG. 11 are made in contact with an MgO film 54 of the front plate 3 at contact areas 44 that are regularly arranged in openings 52 provided in the X electrode 10 of plane electrodes each of which is composed of a transparent electrode 8 of ITO film and a bus electrode 9-1, 9-2 shown in FIG. 10. These openings 52 are arranged on the cross points of the bus electrode 9-1, 9-2, and thus the areas of the openings 52 can be increased, resulting in the fact that the capacitance coupling can be suppressed and that the assembly precision can be alleviated. Similarly, if the projections 41 are made of glass posts, the capacitance can be further reduced.

As another embodiment of the invention, two inventions can be combined as will be understood from FIGS. 8 and 9. Thus, it is also possible to further alleviate (weaken) the capacitance coupling between the electrodes formed on the front plate 3 and back plate 4 with the metal partition walls 5 provided as shown in FIG. 1.

As shown in FIG. 9 and FIG. 11, the projections 41 provided on the metal partition walls 5, when formed on a single metal sheet, are formed by both side etching. In addition, the projections 41 may be provided as dielectric posts on both sides. When the dielectric posts are made of glass, glass posts about tens of microns high can be easily formed at the positions shown in FIGS. 8 and 10 by increasing the firing temperature on the perforated metal structure to reduce the viscosity of glass and by utilizing the surface tension. There is another means in which the projections 41 are formed on one side of the metal sheet, and then another metal sheet is attached to the other flat side. Two metal sheets may be stuck through a glass insulating film formed on the surface after etching the metal partition walls 5. If metal partition walls (not shown) of a unitary construction consisting of the metal partition walls 5 are provided on the front plate 3 shown in FIG. 11 and back plate 4 shown in FIG. 9, the load capacitances can be further reduced between the Y electrode 17 and X electrode 10, and between the A electrode 15 and X electrode 10. Thus, devices, ICs having small driving ability can be used, and the consumption power (reactive power) proportional to the load capacitance Clxy can be greatly reduced. This results in the fact that the power recovery circuit can be made compact and that the drive circuit can be produced at low cost.

Moreover, since the metal partition walls of high aspect ratio can be produced with high precision and with ease, a sheet-like thin plate, in some case, is etched and has multiple layers of more than three layers stacked thereon. An alumina oxide film is formed by ion plating or a glass insulating layer by electrodeposition, on the surface of each precisely etched sheet. The projections 41 or the like are formed on two outer surface layers that constitute the multilayered metal partition walls, and a plane layer is formed on both sides as the other layer. The metal partition walls of high aspect ratio can be formed by laminating sheet-like thin plates. At the same time, the hole shape of the sheet that is formed in the inner layers of the metal partition walls is sometimes narrowed to shield against the light from the discharge between the A, Y electrodes, thereby increasing the contrast. In some case, the thickness or number of layers of an alumina oxide or glass insulating layer is increased by taking a multilayer structure to thereby decrease the stray capacitance, Clmm as viewing from the outer surface layer of the metal partition walls, and to further decrease the coupling capacitance between the electrodes formed on the front plate 3 and back plate 4 shown in FIG. 1. Although the load capacitance Clxy is chiefly given by the series connection of a capacitance Clxm formed between the X electrode 10 and metal partition wall (not shown), and a capacitance Clym formed between the Y electrode 17 and metal partition wall (not shown), it will become the series connection with the stray capacitance Clmm further added if there is an effect of the stray capacitance Clmm of the metal partition wall itself. Particularly, the two capacitances Clxm, Clym are made substantially equal from the standpoint of the stabilized operation against the symmetrical pulse voltage waveforms applied between the X, Y electrodes.

Figure 12:
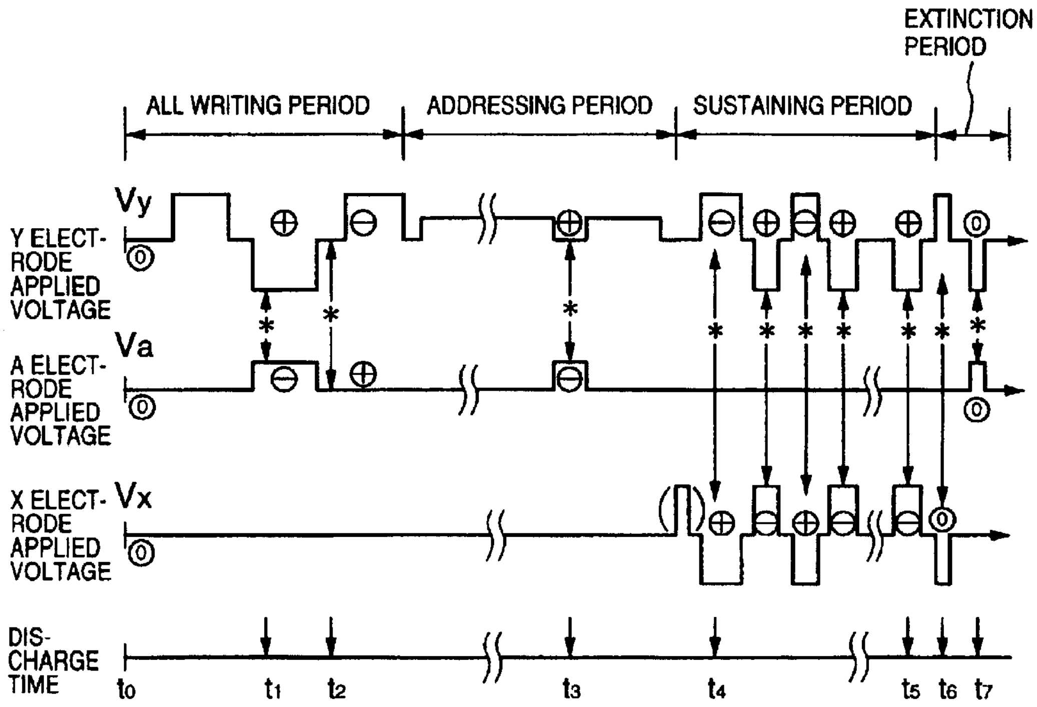
FIG. 12 is a timing chart of the drive waveforms used in a plasma display panel according to the invention.

FIG. 12 is a timing chart of the driving system and driving waveforms of a plasma display panel shown in FIGS. 1 through 9, as another embodiment of the invention.

The fundamental waveform of one sub-field (about 1.6–2 msec period) shown in FIG. 12 is composed of four periods of all writing period, addressing period, sustaining period and extinction period. The symbols, 0, +, − attached within the small circles shown in FIG. 12 indicate wall electric charges after discharge on the three electrodes of X, Y and A (actually, the true electrode is the dielectric film of MgO formed on the conductor electrodes because of AC discharge type). They, respectively, show the cases where the amount of wall charge is zero or can be neglected, positive charge is formed, and negative charge is formed. In addition, the symbols * with arrows indicate to cause main discharge between two electrodes. The wall charges on the three electrodes are fundamentally zero at starting time point $t_{056}$ and ending time point $t_{757}$ of one sub-field. The operation in each period will be described below.

In the all writing period, discharge is caused at time points $t_1$, $t_2$ between the two Y, A electrodes. At the ending time point of the period, for example, negative charge and positive charge are respectively generated on the Y electrode and A electrode in the display cells of all regions of the plasma display panel 1 shown in FIG. 1. This charge generation is made for decreasing the voltage that is applied between the Y, A electrodes to cause writing discharge during the next addressing period.

At the discharging time point $t_1$, a pulse voltage Vy to be applied to the Y electrode is changed from a positive voltage (180v) to a negative voltage (−180v), or AC operation is made considering the firing potential Vo between the electrodes, thereby effectively decreasing the pulse voltage Vy. The pulse voltage Va to the other A electrode is decreased to a low voltage (60v) at the same time. Particularly when the discharge conditions are not satisfied by the pulse voltages Vy, Va to the Y, A electrodes, a positive voltage (250–350v) of pulse voltage Vx is applied to the X electrode at time $t_1$ (not shown in FIG. 12), causing all writing discharge between the X, Y electrodes, specifically, between the Y electrode and the M electrode of metal partition walls. At this time, since the discharge location is separated from the surface of the display cell, there is a small effect on the contrast.

When the pulse width at the initial discharging time point $t_1$ is selected to be about 10 to 20 $\mu$sec, the wall charge is extinguished by itself at the next discharging time point $t_2$. Moreover, the pulse voltage Vy of a positive voltage (180v) is applied for more than 10 $\mu$sec in order to effectively generate a negative charge on the Y electrode and a positive charge on the A electrode immediately after the discharging time $t_2$. When the pulse voltage Vx is used, a positive voltage (about 50v) is applied to the X electrode in order for the wall charge not to be generated (not shown in FIG. 12).

During the addressing period, under the condition that positive charge and negative charge are generated on the A electrode and Y electrode, respectively, the pulse voltage Vy of 40v as a Y scan pulse is applied to the Y electrode, and the pulse voltage Va of 60v is applied to the A electrode selected from the display cells 2 shown in FIG. 1 in order to excite by Y scan. At time $t_3$, writing discharge is caused to generate positive charge on the Y electrode. Thus, positive charge is generated on the Y electrode that is selected at the time of writing discharge, and negative charge at the time of all writing is kept on the Y electrodes not selected. The discharge conditions are established according to the wall charge (wall voltage) produced at the time of all writing, the voltage which the pulse voltage Vy has dropped, and the value of the pulse voltage Va to be applied.

As will be understood from the in-plane electrode structure shown in FIGS. 1 through 9, the gap length between the A electrode and Y electrode is reduced to about tens of $\mu$m, and the pulse width of pulse voltage Va at $t_3$ is reduced to 1.0 to 1.5 μsec as compared with the case of opposite electrode structure. This results in decreasing the length of the address period that increases in proportion to the pulse width (speed-up of the addressing), and increasing the length of the sustaining period in one sub-field. In other words, the in-line electrode structure is able to reduce the pulse width of the writing pulse to the A electrode, and increase the number of sustaining pulses which will be described later, thereby achieving high brightness.

During the sustaining period, discharge light emission is maintained between the X, Y electrodes of a selected display cell. The pulse voltages Vy and Vx to be applied to the X, Y electrodes are made to have opposite signs (+−), but the absolute values are equal. Thus, it is possible to stabilize the discharge phenomenon and decrease the voltage for operating the drive circuit. For the first pulse, the M electrode of the metal partition walls is grounded or driven as the cathode electrode by synchronously making it equal to the potential of the X electrode so that discharge is caused to the writing cell (exchange of partition wall charge on Y electrodes). For the second pulse and the followings, the M electrode is driven as the anode electrode by applying a higher one of the pulse voltages that are applied to the X, Y electrodes. The absolute value of the pulse voltage Vy, Vx shown in FIG. 12 is 180v. At this time, a pulse voltage of 180v is applied to the metal partition wall as the anode electrode in synchronism with the pulse voltage Vy, Vx. The potential of the anode electrode can also be much decreased by properly selecting the driving conditions. Thus, the M electrode of the metal partition walls may be always grounded for the pulses including the second pulse and the followings.

The positive voltage (180v) is applied as the first pulse of the pulse voltage Vy, causing discharge light emission at time $t_4$ under the presence of the wall charge (positive charge) on the Y electrode of a selected display cell during the addressing period. Particularly, the pulse width is selected to be 10 μsec in order that discharge is assuredly caused at time of the second pulse and the followings, or that necessary wall charges are generated on the X, Y electrodes. At the second and following pulses, the pulse width is decreased by generating enough wall charge, and the number of times of discharge light emission (sustaining pulse number) is increased, thus improving the brightness.

As to the final pulse of time $t_5$ during the sustaining period, the pulse voltage Vy and pulse voltage Vx are negative voltage (−180v) and positive voltage (+180v), respectively.

In addition, when erroneous discharge at cells not selected is required to prevent, a short pulse having a width (about 0.5 μsec) and positive voltage (+200v) may be applied to the X electrode at the initial time of the sustaining period [shown in FIG. 12 within the bracket], extinguishing the discharge to remove the negative charge generated on the Y electrode.

As shown in FIGS. 1 through 9, when the X, Y electrodes take the opposite electrode structure and the partition walls are of high aspect ratio, the gap length between the X, Y electrodes increases, but the metal partition walls replacing the dielectric partition walls can reduce the effective gap length. The mechanism of discharge between the X, Y electrodes at the first pulse time $t_4$ will be described below.

At the display cell selected by writing discharge, a preliminary discharge (pilot-light discharge) is caused between the Y electrode on which positive charge is generated and which is driven as the anode electrode, and the metal partition wall (M electrode) driven as the cathode electrode, generating ionized gas (priming particles) of Ne—Xe (5%), 500 Torr gas enclosed in the cells. Immediately after that, main discharge begins between the X, Y electrodes, generating positive column.

In addition, the capacitances Clxm, Clym formed between the metal partition wall and X, Y electrode as described above are made equal by adjusting the electrode area, dielectric thickness and dielectric constant in order to assure the stability of discharge against the applied voltage.

On the other hand, in order to surely cause discharge at the first pulse, the capacitances Clym, Clxm may be made different so that the voltages applied to the two gaps have a bias. This effectively reduces the sustaining voltage composed of the pulse voltage Vy (180v) and pulse voltage Vx (−180v), and also decreases the wall charge (wall voltage) on the Y electrode for writing during the addressing period.

In the case of extinguishing period, the wall charges generated on the Y, X and A electrodes are extinguished (initialized) at time $t_5$ when the sustaining period ends. The discharge between the X, Y electrodes at time $t_6$ serves as extinguishing discharge (fine line extinction system) because the electric field immediately after discharge is removed by decreasing the pulse width so that the wall charge can be prevented from being generated. At the same time, the wall charge generated on the A electrode can also be neutralized. Particularly when positive charge is left on the A electrode, extinction discharge is made at time $t_7$ between adjacent Y, A electrodes.

For the extinction/neutralization of remaining wall charge, the applied voltage between the X, Y electrodes may be reduced up to the minimum maintaining voltage level, and the pulse width may be made long (bold line extinction system). In addition, these two extinction systems may be combined to make the extinction effective.

Figure 13:
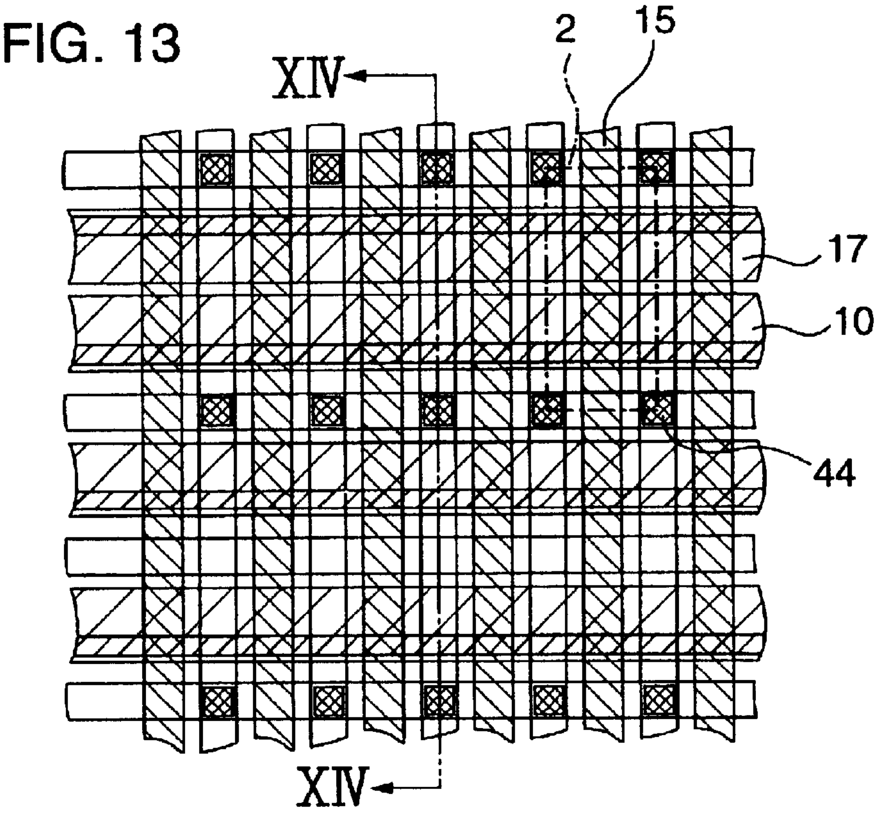
FIG. 13 is a plan view showing the assembly structure of partition walls and electrodes of a plasma display panel according to the invention.
Figure 14:
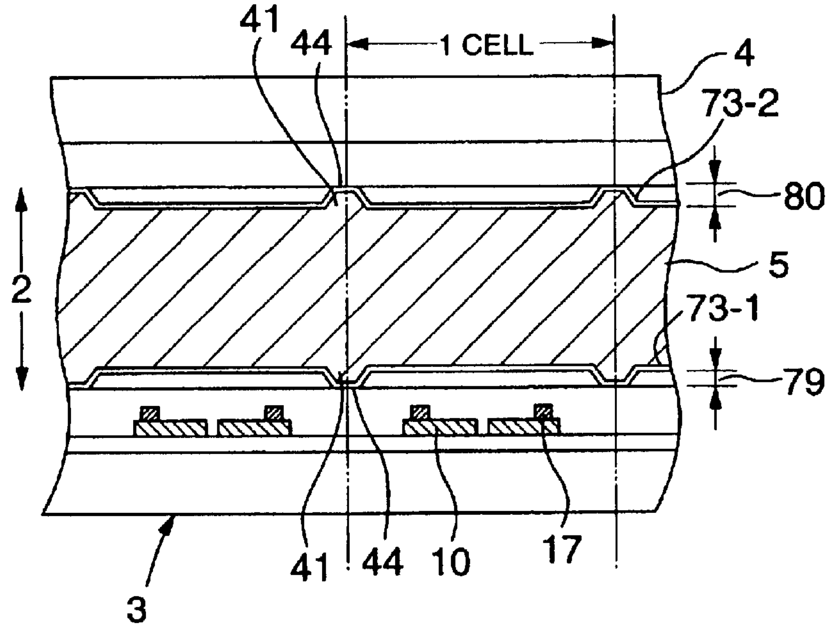
FIG. 14 is a cross-sectional view indicated by the arrow XIV—XIV on FIG. 13, showing the assembly structure of partition walls and electrodes of a plasma display panel according to the invention.

FIGS. 13 and 14 show another embodiment of the invention. FIGS. 13 and 14 are a plan view and cross-sectional view of the assembly structure combining a front plate 3, metal partition walls 5, and back plate 4. FIG. 14 is a cross-sectional view taken along the arrow XIV—XIV in FIG. 13.

A display cell 2 as one cell region is composed of three pieces of the front plate 3 having an X electrode 10 of common display electrode and a Y electrode 17 of display electrode oppositely arranged in the same plane, the metal partition wall 5 produced by perforating an Fe—Ni-based metal sheet and covering the surface of the produced cell space with an alumina oxide or glass insulating film 73 (73-1, 73-2), and the back plate 4 having an address electrode (A electrode) 15 arranged to intersect with the X electrode 10, and Y electrode 17. The display light emission discharge between the X electrode 10 and Y electrode 17 takes the surface discharge type. The metal partition wall 5 at this time serves as the anode electrode and grounded. Thus, a negative pulse Vsus (180v) is applied to one of the X, Y electrodes which serves as the cathode electrode.

The X electrode 10 and Y electrode 17 are formed by a transparent electrode of ITO film and a bus electrode (which may be a thick film electrode) of Cr/Cu/Cr film after an underlayer of $SiO_2$ is formed on a transparent glass substrate though symbols are omitted. In addition, a dielectric layer, MgO film is deposited thereon to complete the front plate 3. The back plate 4 is produced by depositing an underlayer of $SiO_2$ on a glass substrate, and forming the Cr/Cu/Cr film of A electrode (which may be a thick film electrode), and then a dielectric layer. The metal partition walls 5 may be produced by stacking two or more thin sheets (the thickness:

about 50 to 70 μm) on which the alumina oxide or glass insulating film 73 is deposited after perforation. Although not shown, phosphor about 20 μm thick is coated on the inner surface of the display cell 2 surrounded by the metal partition walls 5 and the back plate 4. The phosphor may be separately coated before the assembly except after the assembly of the back plate 4 and the metal partition walls 5.

Since the metal partition walls 5 are used in place of the dielectric partition walls, strong partition walls can be produced with ease, and also the field crosstalk and charge crosstalk can be prevented by the shield effect. This is advantageous in making the cells of panel in a minute size. Moreover, since the metal partition walls 5 can effectively reduce the gap length between the A electrode 15 and Y electrode 17, the firing potential Vo, a-y is reduced, and the address voltage is decreased with ease. Moreover, fast addressing (about 1 μsec) can be attained in the address discharge between the opposite electrodes by a method of generating negative charge (electrons) in place of positive charge on the Y electrode.

In the case of the three-electrode structure of metal partition walls 5, however, the increase of capacitance between two electrodes through the metal partition wall 5 causes a problem. According to the invention, projections 41 are provided on both sides of the metal partition wall 5 in order to solve this problem. The projections 41 are arranged to be located at contact regions 44 where they are not overlapped on the three electrodes formed on the front and back plates 3, 4. In addition, the shape, dimensions, and area of the projections 41 are set to be small so that the capacitances between the electrodes are not increased as compared with the dielectric partition walls. The height 79 of the metal partition walls 5 is selected to be within a range of 100 to 200 μm from the standpoint of the characteristics of the surface discharge type. However, in the places other than the contact areas 44 where the projections formed on both sides overlap on the front plate and back plate 4, gaps of 5–50 μm are formed considering the charge crosstalk and exhaust conductance between the cells. Particularly, the gap lengths 79, 80 in the longitudinal direction of the display cells 2 are set to be about 5–30 μm in order to prevent the optical crosstalk and charge crosstalk between the cells. The projections 41 in this case are made of metal. When the capacitances between the electrodes are required to reduce, dielectric posts may be provided. In this case, the dielectric posts are formed on the metal partition walls 68 or on the front and back plates 3, 4.

Figure 15:
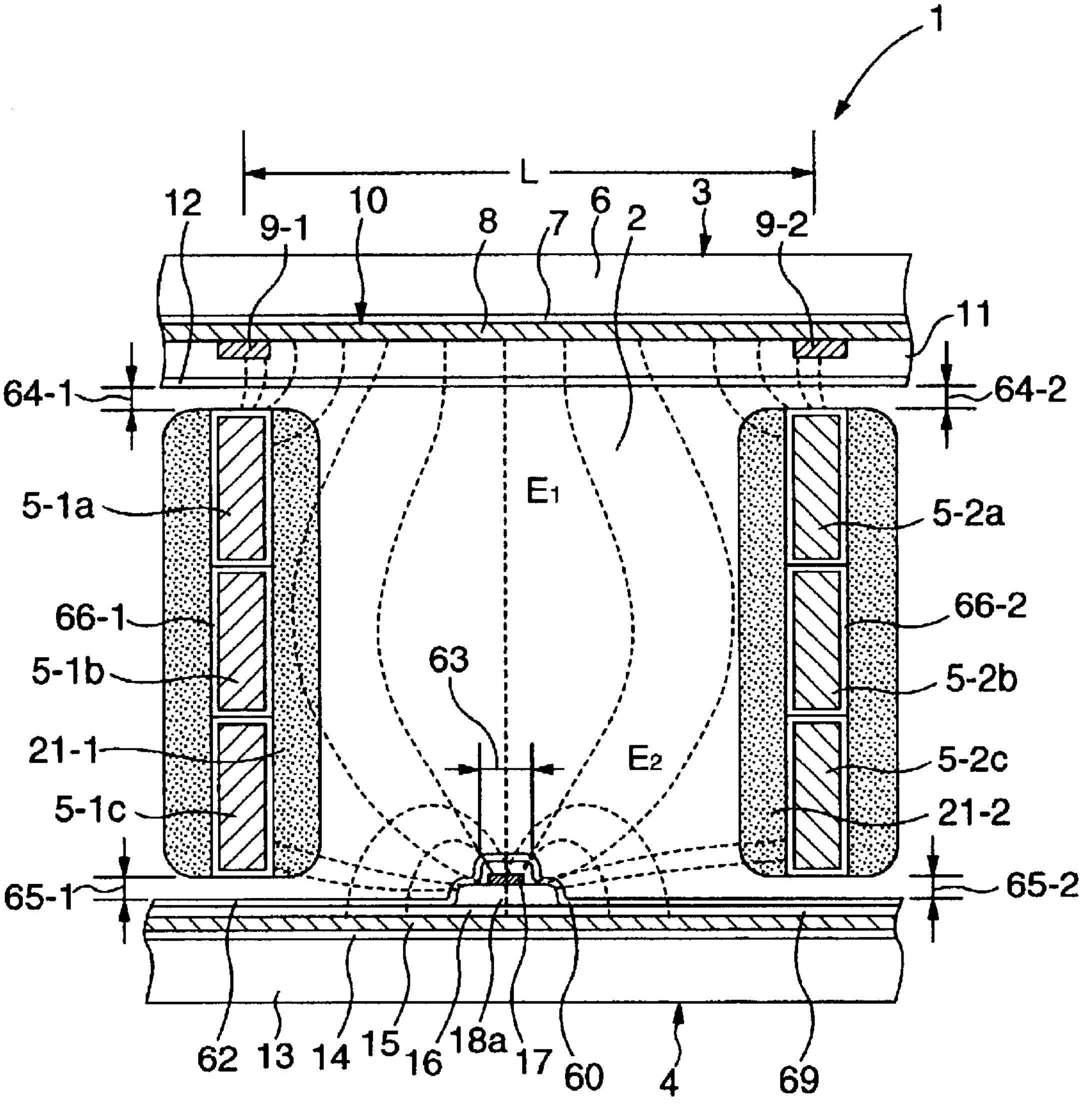
FIG. 15 is a cross-sectional view indicated by the arrow XV—XV on FIG. 18, showing the display cell structure of a plasma display panel according to the invention.
Figure 18:
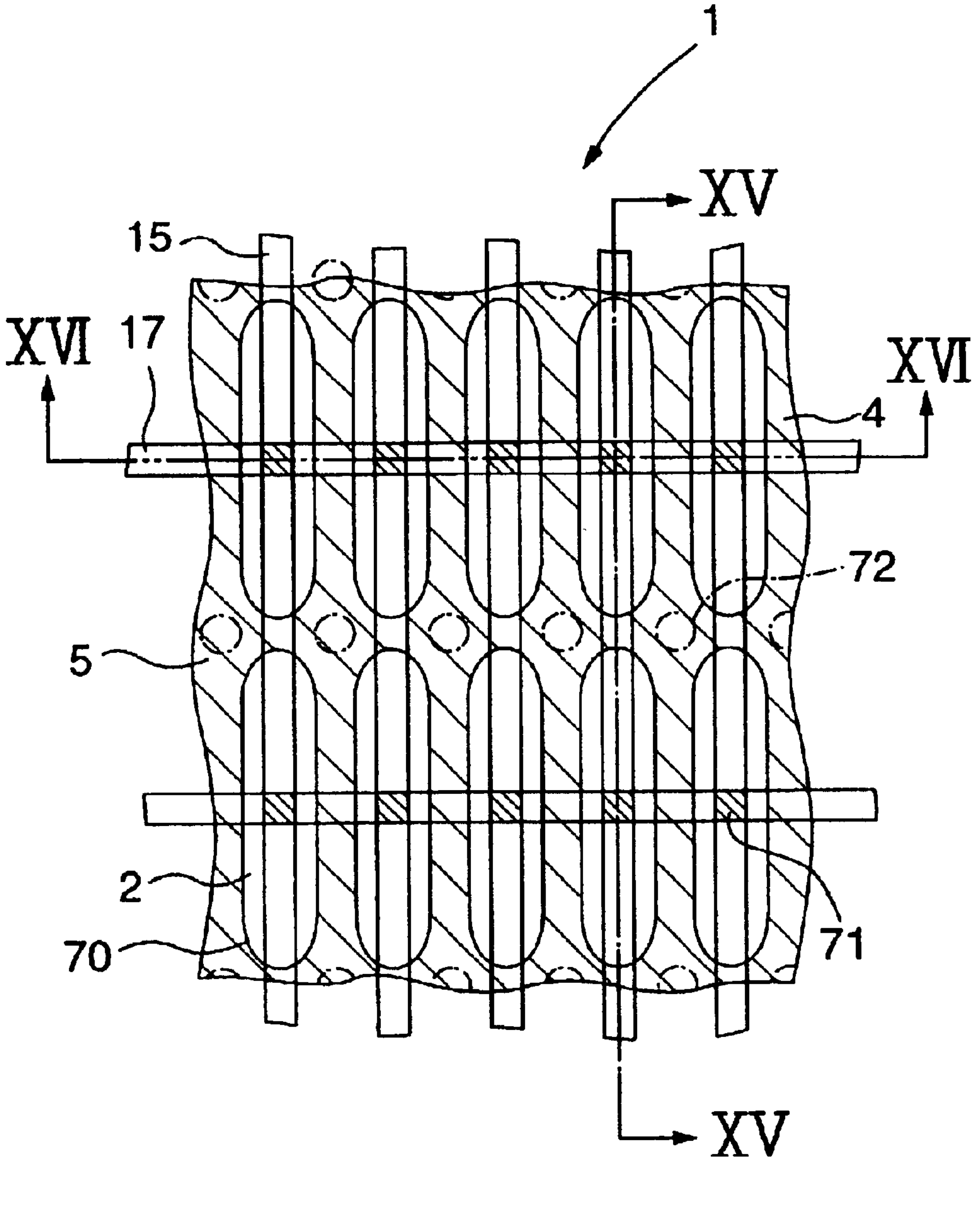
FIG. 18 is a plan view showing the display cell structure of a plasma display panel according to the invention.

FIG. 15 shows another embodiment of the invention, and is a cross-sectional view indicated by the arrow XV—XV on FIG. 18, of the display cell 2 of the plasma display panel 1, taken in the long size direction.

The plasma display panel 1 takes the three-piece structure consisting of the front plate 3, back plate 4 and metal partition wall 5 (5-1*a*, 5-1*b*, 5-1*c*, 5-2*a*, 5-2*b*, 5-2*c*).

The front plate 3 has the transparent glass substrate 6, the transparent underlayer 7 of $SiO_2$, the transparent electrode 8 of ITO film, and the bus electrodes 9 (9-1, 9-2) of small resistivity p formed in turn. The bus electrodes 9 and transparent electrode 8 constitute the plane electrode, or the common display electrode (X electrode) 10 for the display cells 2.

The bus electrodes 9 are formed by a thick film conductor of an opaque Ag-based material, but may be formed by a metal laminate (thin film) of Cr/Cu/Cr up to a thickness of about a few μm. Moreover, the bus electrodes 9 may be formed by use of a black conductive material to serve both as black matrix and as itself. On the transparent electrode 8 and bus electrodes 9, there are sequentially deposited the dielectric layer 11 of a thick film (which may be a thin film for controlling the wall charge or wall voltage) for assuring a dielectric strength and accumulating charge, and the protective layer 12 of MgO having a large secondary electron emission coefficient and excellent in the sputtering resistance. The protective layer 12 may be formed by a thick film from the standpoints of process and cost. In addition, it is very preferable that the protective layer 12 be made of a material for low cathode drop voltage Vc in order to improve the discharge efficiency (light emission efficiency).

The back plate 4 has the glass substrate 13, the underlayer 14 of $SiO_2$, the address electrode (A electrode) 15 of an Ag-based thick film conductor, and the thick-film dielectric layer 16 formed in turn. In addition, the display electrode (Y electrode) 17 of an Ag-based thick film conductor is formed in a line pattern on the dielectric layer 16 with another dielectric layer 18*a* interposed therebetween. The dielectric layer 18*a* underlies the dielectric layer 17. The regions 19 (19-1, 19-2) are left in the inside of the display cells 2 since the dielectric layer 18*a* does not entirely cover the dielectric layer 16 that is the underlayer of the dielectric layer 18*a*. Also, the dielectric layer 60 covers the Y electrode 17, the surrounding area of the Y electrode 17, and the dielectric layer 18*a*.

Particularly when the dielectric layer 60 is formed on the dielectric layer 16 as well as on the dielectric layer 18*a*, the dielectric layer 60 leaves the regions [including the bare regions 19 (19-1, 19-2)] not covered on the dielectric layer 16 in the inside of the display cells 2. The protective layer 22 of MgO film covers the entire surface of the back plate 4 including the dielectric layer 60, dielectric layer 18*a* or the dielectric layer 16. Although the A electrode 15 and Y electrode 17 are formed with a thick film conductor to attain simple process and low cost, they may be formed with a metal laminate of Cr/Cu/Cr.

The structure of the two dielectric layers 18*a*, 60 deposited near the Y electrode 17 can remove the increment of the firing potential Voa-y between the A electrode 15 and Y electrode 17, while the plane layer structure could not prevent the firing potential from being increased due to the thickness of the dielectric layers 18*a*, 60. In addition, the dielectric strength Vdo and the load capacitance Cla-y can be increased and decreased, respectively since the dielectric layer 18*a* of a thickness is inserted between the A electrode 15 and Y electrode 17. In other words, the increase of S dielectric strength Vdo and decrease of load capacitance Cla-y can be attained with ease by decreasing the areas of the intersections 71 (FIG. 18) between the A electrode 15 and Y electrode 17 and making the dielectric layer 18*a* a multilayer structure to increase the thickness. In addition, the reduction of the firing potential Voa-y can be easily achieved by removing the effect of the thickness of dielectric layer 18*a* and decreasing the thickness of the dielectric layers 16, 60 at the intersections 23 (FIG. 3) between the A electrode 15 and Y electrode 17. Moreover, the address drive voltage generating the electric force lines E2 is reduced stably and remarkably. Therefore, the increase of dielectric strength Vdo and the decrease of load capacitance Cla-y can be realized at the same time without increasing the firing potential Voa-y between the A electrode 15 and Y electrode 17. That is, newly inserted dielectric layer 18*a* and the dielectric layer 60 added with a new structure can expand the freedom of structure design against the firing potential Voa-y, dielectric strength Vdo and load capacitance Cla-y.

The metal partition walls 5 (5-1*a*, 5-1*b*, 5-1*c*, 5-2*a*, 5-2*b*, 5-2*c*) can be easily produced by perforating, by etching or the like, an Fe—Ni based sheet of which the thermal expansion coefficient is made coincident with that of the glass substrate 6, 13, depositing the insulating oxide film 66 (66-1, 66-2) on the surface, and laminating three sheets (a, b, c) to make the holes have a high aspect ratio. The oxide film 66 may be replaced by a glass insulating film formed by electro-deposition or by an aluminum oxide film formed by ion plating in order for the dielectric strength of the insulating film to be increased.

The phosphor 21 (21-1, 21-2) of a substantially uniform thickness is coated on the inner side of the holes provided by the metal partition walls 5. In addition, the partition structure of high aspect ratio (electrode interval: about 0.5 to 2.0 mm) is able to increase the phosphor coating area 2–5 times (as large as that of the surface discharge type), thus increasing the brightness with ease. Although the phosphor 21 is coated before the metal partition walls 5 are connected to the back plate 4, it may be coated after the connection.

The number of electrodes provided on the display cells 2 is three except for the common electrode of metal partition wall 5. The plane X electrode 10 and line-shaped Y electrode 17 are opposed through the metal partition wall 5 having an insulating film on the surface, and the line-shaped A electrode 15 and Y electrode 17 perpendicularly intersect with each other through the dielectric layer 16. The metal partition walls 5 are interposed between the front plate 3 and back plate 4 in order to form the display cells 2. Two gaps 64 (64-1, 64-2), 65 (65-1, 65-2) are formed on both sides of the front and back plates 3, 4 in order to form a high field region in the cathode dark space, reduce the wiring capacitance between the electrodes (Clx-y, Cla-y), and assure the exhaust conductance. The size of the two gaps is preferably made large to some extent for the above reason, but limited to the thickness δ (tens of μm ) of the sheath because of the generation of charge crosstalk. The contact structures formed between the metal partition wall 5 and the front plate 3 or back plate 4 in order to produce the gaps 64, 65 are the projections provided at the positions (for example, the contact areas 72, 73 at the four corners of the display cell 2 shown in FIGS. 18 and 19 as will be described later) where the surfaces of the partition wall and the front or back plate 3, 4 are opposed and the projections do not overlap on the electrodes formed on the plate 3 or 4. If there is no problem in the structure, the contact areas 72, 73 are not necessary to be provided at all the four corners of the display cell 2 in order to decrease the capacitances between the electrodes. The projections are formed in a shape or structure by processing both sides (or one side) of the metal partition wall 5 or by additionally depositing a new dielectric layer on the front or back plate 3, 4 to form circular, line-shaped or cross-shaped dielectric posts (not shown). Particularly when the projections are formed on the back plate 4, the new dielectric layer may be substituted by the above-mentioned dielectric layer 18*a*, 60 so that the number of process steps can be reduced.

The firing potential Vox-y between the X electrode 10 and Y electrode 17 arranged to have a long electrode distance (0.5 to 2.0 mm) to cause positive column is effectively reduced even by the metal partition wall 5 of high aspect ratio. Therefore, the structure of the two gaps is chiefly changed to make the firing potential not dependent on the electrode distance as indicated by the electric line of force, E1. The display light emission discharge is generated by the potential difference between the display panel voltage VA at the anode electrode set equal to the potential Vm of the metal partition wall 5 and the display pulse voltage VK of the cathode electrode with a negative wall voltage added. A high electric field region necessary for the cathode dark space is generated around the two gaps 64, 65 alternately.

Figure 16:
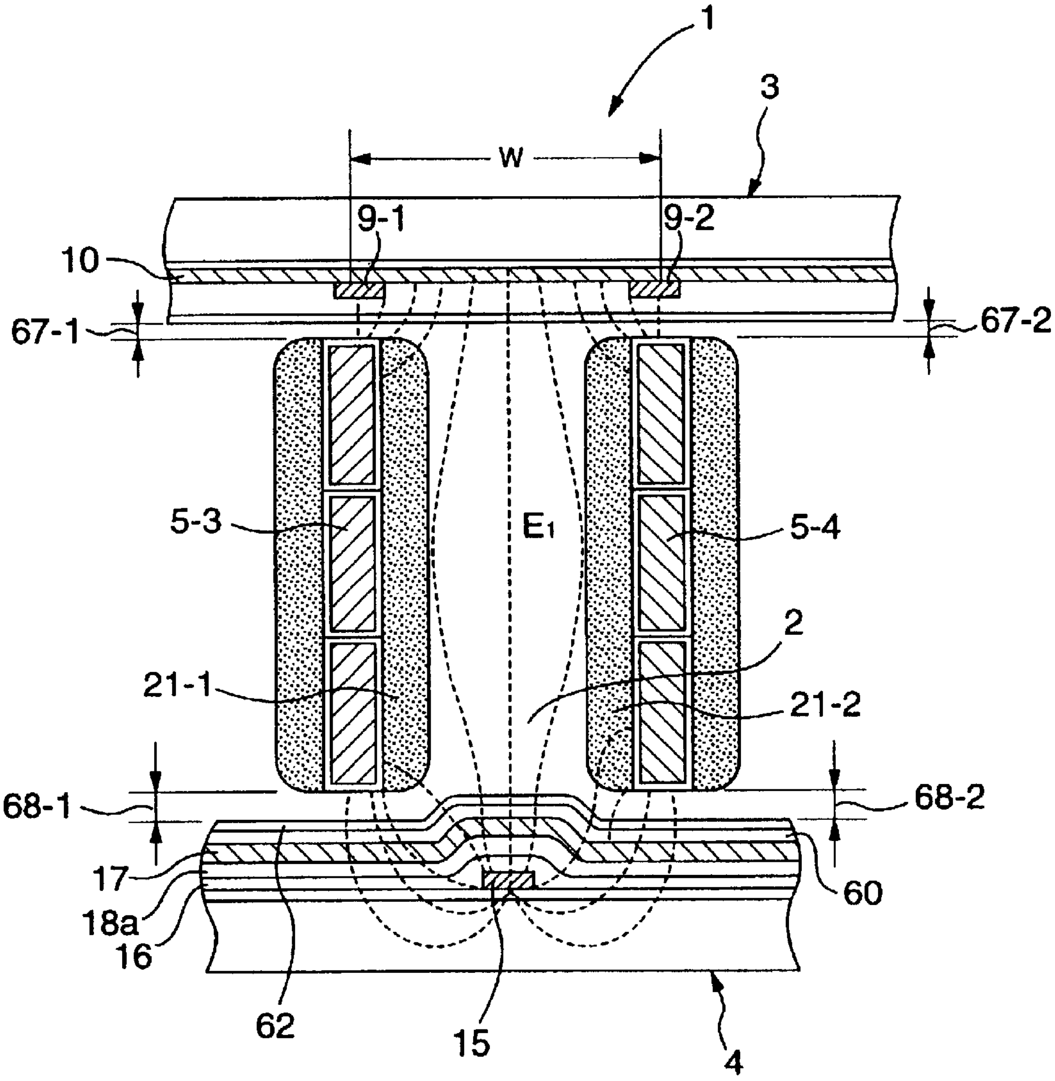
FIG. 16 a cross-sectional view indicated by the arrow XVI—XVI on FIG. 18, showing the display cell structure of a plasma display panel according to the invention.

FIG. 16 is a cross-sectional view indicated by the arrow XVI—XVI on FIG. 18, of the display cell 2 of the plasma display panel 1 as viewing in the short size direction. The gaps, 67 (67-1, 67-2), 68 (68-1, 68-2) between the metal partition wall 5 (5-3, 5-4) and the front plate 3 or back plate 4 are made different in size and shape from the gaps 64, 65 shown in FIG. 15 in order to generate a high electric field region in the cathode dark space, reduce the wiring capacitance between the electrodes, and assure the exhaust conductance. Particularly to increase the exhaust conductance in the direction of the line of A electrode 15, the size of the gaps 64, 65 is made about twice larger than that of the gaps 67, 68 according to the thickness δ of the sheath. Thus, the dielectric layers 11, 69 are formed by a multilayer pattern.

Figure 17:
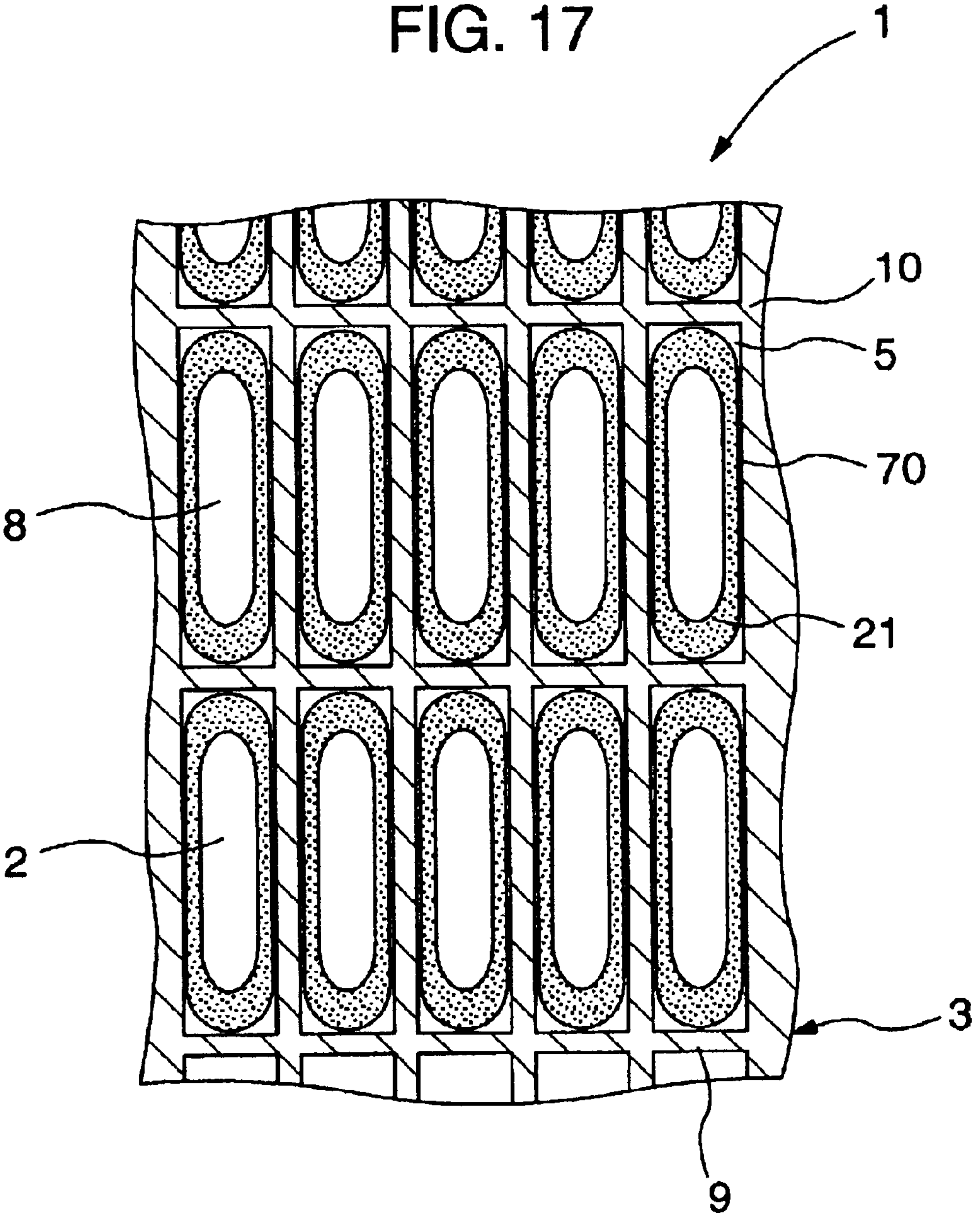
FIG. 17 is a plan view showing the display cell structure of a plasma display panel according to the invention.

FIG. 17 is a plan view of the plasma display panel 1 as viewing from the front plate 3 side.

The bus electrode 9 (9-1, 9-2) is formed in a lattice shape to match the hole shape 70 of the metal partition walls 5 (FIG. 16) that determines the openings of the display cells 2, and not to affect the opening area of the display cells 2. The phosphor 21 is coated on the inner side of the hole shape 70 so that the thickness in the longitudinal direction of the display cell 2 is twice or more thicker than that in the transverse direction, thereby raising the brightness and light emission efficiency. The structure of the bus electrode 9 formed in a lattice shape in addition to the transparent electrode 8 of ITO film formed in the plane structure is effective to reduce the electrode resistance of the X electrode 10 so that the consumption power can be greatly reduced and that the drive voltage can be prevented from being reduced due to the electrode resistance (the operation margin can be improved). In addition, even if the width of the bus electrode 9 formed in a lattice shape is small enough unlike the comb-like electrode, the electrode resistance of the X electrode 10 can be reduced. Therefore, the width of the bus electrode 9 can be reduced (about 50–100 μm or below) to match that of the metal partition wall 5, and thus the opening ratio of the display cell 2 can be increased tree-fold or above (as compared with the surface discharge type).

FIG. 18 is a plan view of the plasma display panel 1 as viewing from the back plate 4 side.

The A electrodes 15 and Y electrodes 17 intersect at intersection areas 71 in the central portion of the display cells indicated by the hole shape 70 of the metal partition wall 5. The contact area 72 between the metal partition wall 5 and the back plate 4 mentioned with reference to FIG. 15 is provided at the four corners of each of the display cells 2 where there are no A, Y electrodes 15, 17. Therefore, the capacitance between the metal partition wall 5 and A electrode 15 or Y electrode 17, or load capacitance Clx-y, Cla-y can be decreased.

Since the Y electrode 17 is made wide in the longitudinal direction of the hole shape 70 except the neighborhood of the intersection area 71, the load capacitance (wiring capacitance) Cla-y is not increased, and the resistance of the Y electrode 17 is decreased as in the X electrode 10, resulting in reduction of consumption power.

The structure of the intersection area 71 determines the firing potential Voa-y, dielectric strength Vdo and load capacitance Cla-y between the A, Y electrodes 15, 17. From the cross-sectional structure of FIG. 15 and plane structure of FIG. 18*a*, it will be understood that the thickness of the dielectric layer 16 (shown in FIG. 15) cannot simultaneously satisfy both the reduction of firing potential Voa-y and increase of dielectric strength Vdo or both reduction of firing potential Voa-y and reduction of load capacitance Cla-y. Therefore, new dielectric layers 18*a*, 60 are formed as shown in FIGS. 15, 16.

Figure 19:
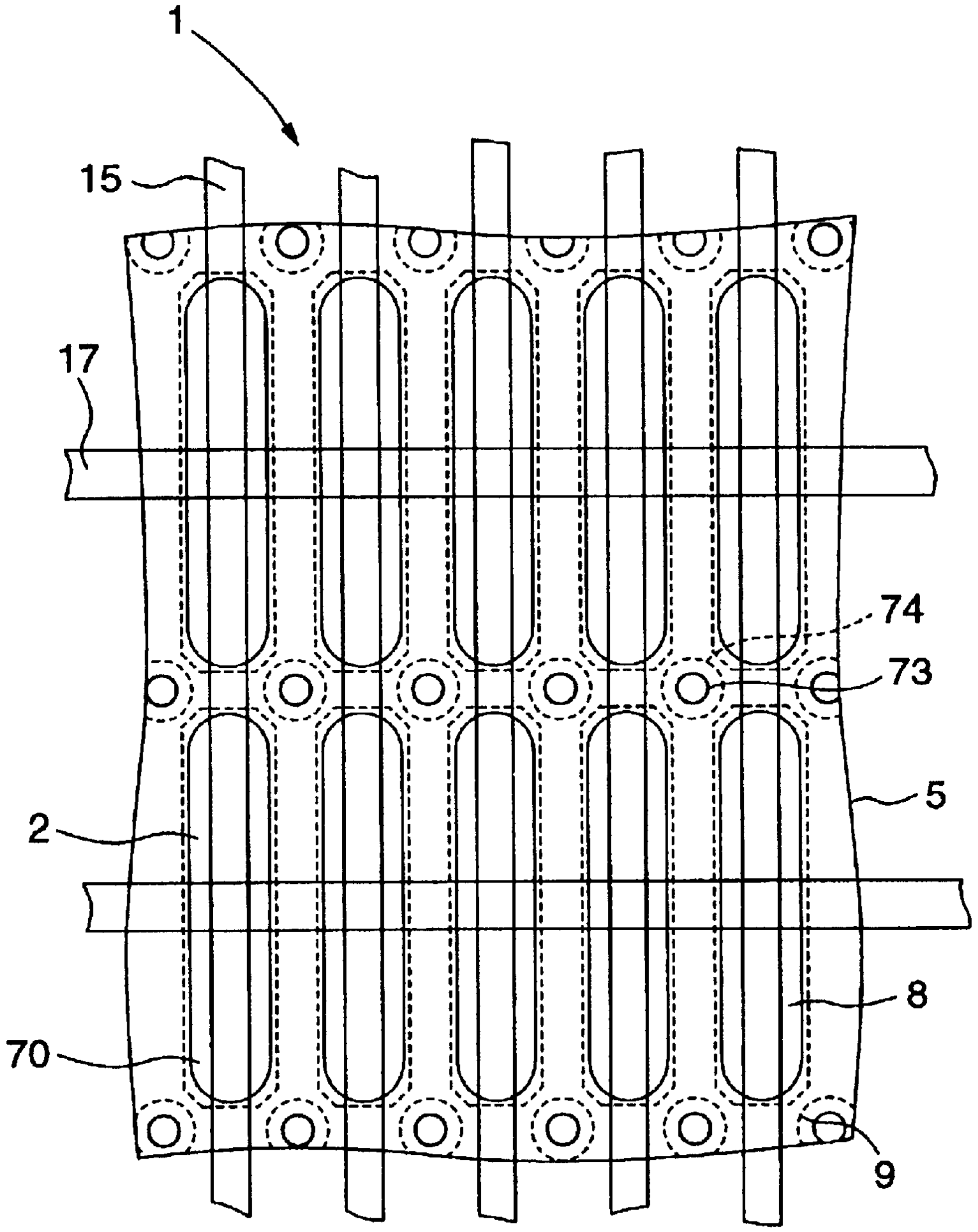
FIG. 19 is a plan view showing the display cell structure of a plasma display panel according to the invention.

FIG. 19 is a plan view of the plasma display panel 1 showing the arrangement of electrodes.

The contact area 73 between the metal partition wall 5 and front plate 3 mentioned with reference to FIG. 15 is provided at the four corners of the display cell 2 at which the A, Y electrodes 15, 17 are not present as in the contact areas 72 shown in FIG. 18. However, openings 74 are locally provided at the positions corresponding to the four corners of the display cell 2 on the transparent electrode 8 and the bus electrode 9 indicated by broken lines so that the projections formed on the metal partition wall 5 or front plate 3 do not directly overlap on the X electrode 10. This structure is effective to reduce the capacitance between the metal partition wall 5 and X electrode, or the capacitance Clx-y.

Figure 20:
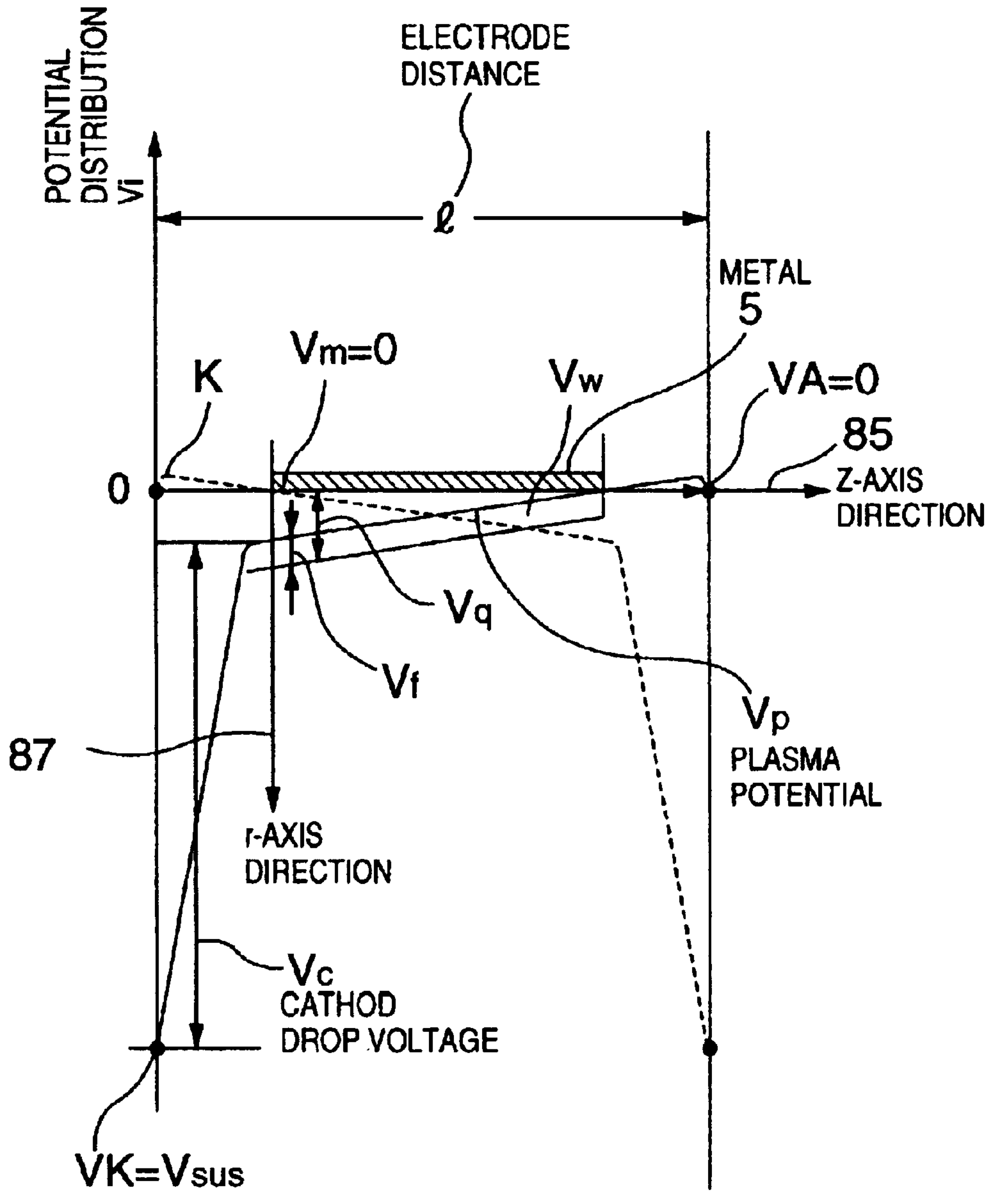
FIG. 20 is a diagram showing the potential distribution within the display cell of a plasma display panel according to the invention.
Figure 21:
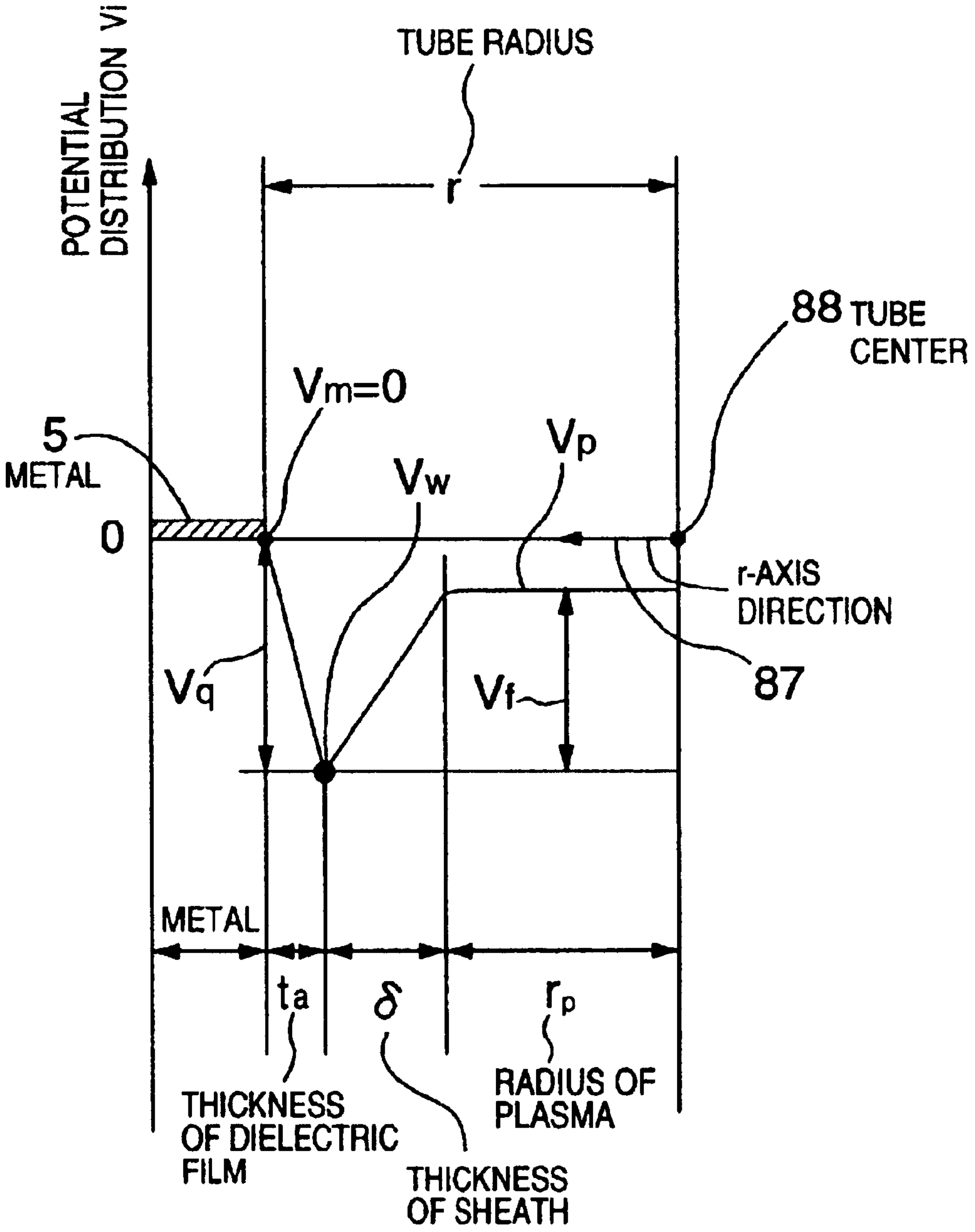
FIG. 21 is a diagram showing the potential distribution within the display cell of a plasma display panel according to the invention.

FIG. 20 shows another embodiment of the invention. This figure shows the potential distribution Vi in the center axis (Z-axis) direction 85 in the case when a glow discharge having positive column occurs within the display cell 2 of the plasma display panel 1 shown in FIG. 15. The center axis (Z-axis) corresponds to the symmetrical axis relative to the cross-section structure of FIGS. 15, 16, and the region of the potential distribution Vi is the distance l between the X, Y electrodes. FIG. 21 shows the potential distribution Vi in the r axis direction, 87 in the region where the positive column is caused in FIG. 20. The r-axis means one of the two short and long axes toward the partition wall from the tube center, 88 that is the center of the rectangular shape of the cell size (L×W, L≧W shown in FIGS. 15, 16). Here, the tube radius r (W/2), of the short axis is used.

During the light emission discharge occurring in the display period, when the metal potential Vm, and anode potential VA were made approximately zero volt, and when the cathode potential VK, was set for a negative display pulse voltage Vsus (−180v), the plasma potential Vp, of the positive column could be brought to be substantially equal to the metal potential Vm (within about tens of volt), thereby generating the positive column stably and efficiently.

Since the plasma potential Vp is made substantially equal to the metal potential Vm, the stray potential Vf, associated with the thickness δ of the sheath as will be understood from the equation (1), and the negative wall voltage Vp, due to the deposition of electrons on the dielectric film (insulating film+phosphor layer) of the metal partition wall 5 can be greatly reduced as compared with those of the dielectric partition wall.

This is because the equipotential region necessary for the positive column is provided by the metal potential Vm to alleviate the electric field strength E1 in the axis direction. This is also ascribed to the facts that the cathode potential VK is set to the negative display pulse voltage Vsus (−180v) the absolute value of which is equal to the cathode drop voltage Vc, and that all the display pulse voltages applied to the anode potential VA and cathode potential VK are added on the cathode dark space, thus effectively generating the high field region. Here, the metal partition wall surface potential Vw, obtained by adding the wall voltage Vq, to the metal potential Vm is balanced by the wall voltage Vq through the stray potential Vf generated on the ion sheath on the basis of the plasma potential Vp. Particularly, the stray potential Vf generated in the region of the positive column tends to be substantially constant since the electron temperature Te is kept equal.

Thus, since the excessive ionization energy is not required by providing the ruling (maintaining) conditions of the glow discharge characteristic for generating the positive column, the discharge maintaining current I (current density J) can be decreased, and the discharge efficiency can be remarkably (more than one order of magnitude, or one place) increased. In addition, since there is the effect to make the excessive ionization energy unnecessary even if the discharge maintaining current I (current density J) is increased, the brightness B is also improved in the region where the brightness is not saturated. Phenomenologically, the shrinkage phenomenon of positive column and accumulated ionization can be suppressed from occurring, and the minimum current density required can be obtained within the range in which the brightness is not saturated (ultraviolet light).

When the metal partition wall 5 was constructed by stacking three insulated laminae (the stray capacitance was formed between the laminae) as shown in FIG. 15, the metal potential Vmj (j=a, b, c) could be generated by applying an external potential to one of the three sheets, and changed according to a slight potential gradient in the positive column region. Thus, the positive column could be generated more stably and efficiently than the metal potential Vm generated when a single lamina was used as shown in FIG. 20.

Here, both external potential and stray capacitance potential were applied to make the metal potential Vm, and both potentials were made substantially equal to zero volt (ground potential). Thus, the effect of the DC voltage component was fully removed, and the voltage operation margin and stability (stabilization of X, Y electrode potential) were improved. When the metal partition wall 5 was constructed by stacking three laminae shown in FIG. 15, the external potential was applied only to the intermediate lamina of j=b in order to improve the stability of discharge considering symmetry.

Figure 24:
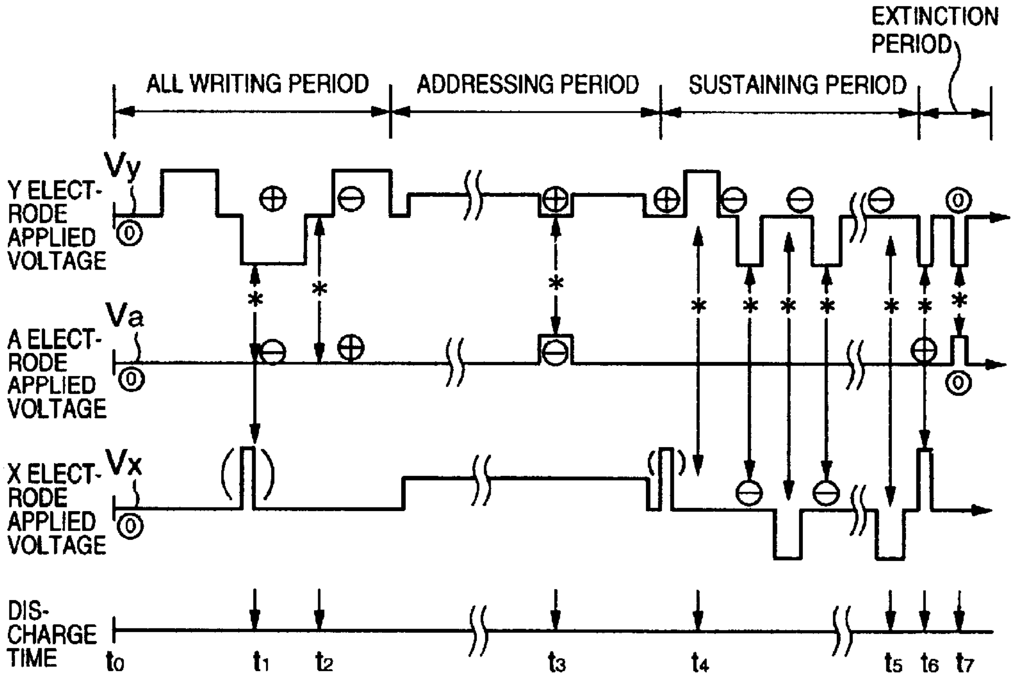
FIG. 24 is a timing chart of the drive waveforms used in a plasma display panel according to the invention.

FIG. 24 is a timing chart for the driving system and driving waveforms in the plasma display panel shown in FIGS. 15 to 21, as another embodiment of the invention.

The fundamental waveform of one sub-field (a period of about 1.6 to 2 msec) shown in FIG. 24 includes four periods of all writing period, addressing period, sustaining period, and extinction period.

The symbols 0, +, − enclosed within the small circles shown in FIG. 24 indicate wall charges on the three X, Y, A electrodes (the actual electrodes are the dielectric MgO films formed on the conductor electrodes because of AC discharge type) after discharge, and respectively show the cases when the amount of each wall charge is zero or can be neglected, when a positive charge is formed, and when a negative charge is generated.

As described the metal potential Vm of metal partition wall 5 with reference to FIGS. 20, 21, both the external potential and stray capacitance potential are applied and substantially made zero volt in order to make the glow discharge generating the positive column be stabilized, and the light emission efficiency and brightness be increased. Therefore, the DC voltage components of the driving waveforms on the X, Y electrodes are set to be substantially zero volt in one sub-field. They may be set to be zero volt in one TV field considering the stability of the voltage operation margin or the like.

The symbol * with arrows chiefly indicates to generate discharge between two electrodes. The wall charges on three electrodes are fundamentally zero at start time to and end time $t_7$ of one sub-field.

The light emission efficiency η of the whole glow discharge is improved by extending the electrode distance l, shown in FIG. 20 or other figures, in the opposite display electrode structure and high aspect ratio metal partition wall structure. However, if the electrode distance l becomes long, the discharge delay time and wall charge deposition time are increased, causing a difference. Thus, to solve these problems, a fast driving system chiefly for electron driving which will be described is used for the opposite discharge in the sustaining period.

Writing discharge is caused between the display electrode (Y electrode) group 17 and trigger electrode (address electrode, A electrode) group 15 of the displace cell 2 to be selected as shown in FIG. 15, generating a positive charge on the dielectric surface of the Y electrode 17 (actually, on the MgO film surface formed on the dielectric layer).

When the sustaining period comes, at the first display light emission discharge time, the display pulse voltage VK (zero volt), and display pulse voltage VA (positive voltage Vsus) are applied to the metal partition wall 5, common display electrode (X electrode) 10 and the Y electrode 17 with a positive wall charge generated, for the cathode electrode and anode electrode, so that pilot-light (preliminary) discharge is caused between the metal partition wall 5 of the cathode electrode and the Y electrode of the anode electrode. Immediately thereafter, the main discharge is developed between the X, Y display electrodes (the cathode and the anode) to reach the glow discharge generating the positive column. The pulse width at this time is about 10 μsec for surely generating wall charge (wall voltage).

At the second and following display light emission discharge time, a sufficiently large amount of electrons is immediately (about 1 μsec thereafter) deposited on the anode electrode when the electrode distance l is 0.5 to 2.0 mm, making it possible to achieve stable and fast memory discharge chiefly forming negative charge.

During this sustaining period, the potential of the metal partition wall 5 is made ground potential, but the first pulse, second pulse and the following pulses are applied to the cathode, anode electrodes. That is, the first pulse serves to covert the positive charge written at the Y electrode into negative charge. The second and the followings enter in the original sustaining period. When negative charge is written at the Y electrode during the addressing period, the first pulse is not necessary, and the writing can be started from the second pulse.

The operation at each period will be described with reference to FIG. 24.

In the all writing period, discharge is caused between the two electrodes, Y, A electrodes at time $t_1$ and time $t_2$. At the end of the period, negative and positive charges are formed on the Y electrode and A electrode, respectively in the display cells 2 of, for example, all regions of the plasma display panel 1 shown in FIG. 15. This operation is made to reduce the voltage applied to the Y, A electrodes that cause writing discharge in the next addressing period.

The discharge at time $t_1$ acts to effectively reduce the pulse voltage Vy, by changing the pulse voltage Vy to be applied to the Y electrode from the positive voltage (180v) to the negative voltage (−180v), or AC operation, considering the firing potential Voa-y between the electrodes. The pulse voltage Va, on the other electrode is reduced to a low voltage (60v) at the same time. Particularly when the pulse voltages Vy, Va on the Y, A electrodes do not satisfy the discharge conditions, the positive voltage (180 to 250v) of pulse voltage Vx, is applied to the X electrode at time $t_1$ (in FIG. 24, a short pulse is indicated within the parentheses) to cause pilot-light discharge that generates priming particles between the X, Y electrodes, specifically, the electrode of metal partition wall 5 and the Y electrode, surely leading to the main discharge between the Y, A electrodes. In this case, the stray capacitance ratio between the metal partition wall 5 and X, Y electrodes is properly selected. In addition, since the discharge is caused at the bottom of the display cell 2 distant enough from the surface, the effect to reduce the contrast in all writing period is small.

When wall charge can be stably generated on the Y, A electrodes at time $t_1$, the addressing period immediately starts, and the sign of the charge can be inverted during the addressing period. This means that the charge exchange on the Y electrode during the sustaining period is executed before the addressing period. Thus, the first pulse to be applied to the Y electrode is not necessary during the sustaining period.

The pulse width at the initial discharge time $t_1$ is selected to be about 10 to 20 μsec, thus causing the discharge by which the wall charge is extinguished by itself at time $t_2$ of the next discharge. Moreover, a positive voltage (180v) is applied as the pulse voltage Vy for more than 10 μsec in order to effectively and stably produce negative charge on the Y electrode and positive charge on the A electrode immediately after the discharge time $t_2$.

In the addressing period, the pulse voltage Vy of Y scan pulse (40v) is applied to the A, Y electrodes with positive and negative charges deposited, and the pulse voltage Va (60v) is applied to the A electrode selected for light emission by Y scan from the display cells 2 shown in FIG. 1, thus causing writing discharge at time $t_3$ to form positive charge on the Y electrode. Positive charge is produced on the selected Y electrode at the time of all writing, and negative charge at all writing time is produced on the Y electrodes not selected. At this time, the discharge conditions are established by use of wall charge (wall voltage) generated by all writing, the voltage drop developed when the pulse voltage Vy falls off, and the applied voltage of pulse voltage Va.

Since the A, Y electrodes are of the in-plane cross electrode structure shown in FIGS. 15, 16, the gap length between the electrodes can be shortened about tens of μm as compared with the opposite electrode structure. In addition, the pulse width of pulse voltage Va at time $t_3$ is reduced from a range of 2 to 3 μsec to half that, or to a range of 1 to 1.5 μsec. As a result, the length of the addressing period increasing in proportion to the pulse width can be reduced (leading to fast addressing). Thus, the length of the sustaining period of one sub-field, or the light emission duty can be increased about twice. In other words, the in-plane cross electrode structure acts to decrease the pulse width of the writing pulse, and increase the number of sustaining pulses, which will be described later, by this decrease, thus improving the brightness.

In the sustaining period, after the charge exchange by the first pulse is executed in the selected display cell, discharge maintaining light emission is caused by the second and following pulses between the selected X, Y electrodes. As described with reference to FIGS. 20, 21, two display pulse voltages VA, VK are applied to the anode electrode as one of the X, Y electrodes, and to the cathode as the other one, respectively. In this case, those display pulse voltages are selected to be zero volt, and a negative sustaining voltage Vsus (−180v), respectively so that the glow discharge generating the positive column is caused stably and efficiently.

Specifically, by using the display pulse voltage VA of positive sustaining voltage Vsus (180v) as the first pulse of the pulse voltage Vy, and the display pulse voltage VK of zero voltage as the first pulse of the pulse voltage Vx and the metal partition wall 5, preliminary discharge (pilot-light discharge) is caused between the metal partition wall where field concentration first occurs, and the anode electrode (Y electrode) at time $t_4$, giving rise to ionized gas (priming particles) of Ne—Xe 5% 400 to 500 Torr gas enclosed within the cells, then immediately shifting to the main discharge between the X, Y electrodes to generate the positive column.

The pulse width of the first pulse for surely generating discharge at time $t_4$ is made particularly as large as 6 to 10 μsec. For the second and following pulses, the pulse width is reduced by fast memory discharge chiefly for generating negative charge in order to increase the number of discharge light emission (the number of sustaining pulses), thus improving the light emission duty. At the final pulse at time $t_5$ in the sustaining period, the pulse voltage Vy and pulse voltage Vx are zero voltage and a negative sustaining voltage Vsus (−180v), respectively. In addition, in order to prevent erroneous discharge in the cells not selected, a positive voltage (+180v) of a short width (0.5 μsec) may be applied to the X electrode at the initial time of the sustaining period, generating extinction discharge for removing the negative charge on the Y electrode.

In the extinction period, the wall charges on the Y, X and A electrodes are extinguished (initialized) at the end of the sustaining period, or time $t_5$. The discharge of short pulse width between the X, Y electrodes at time $t_6$ is extinguished so that the wall charge can be prevented from being generated by removing the field immediately after the discharge (fine line extinction system). Also, the wall charge on the A electrode is neutralized. Particularly when positive charge is left on the A electrode, it is extinguished by the discharge between the adjacent Y, A electrodes at time $t_7$.

In order to extinguish/neutralize the left wall charge, it is possible to reduce the voltage applied between the X, Y electrodes up to the minimum maintaining voltage level, and increase the pulse width (bold line extinction system). In addition, these two extinction systems may be combined and effectively used.

Figure 25:
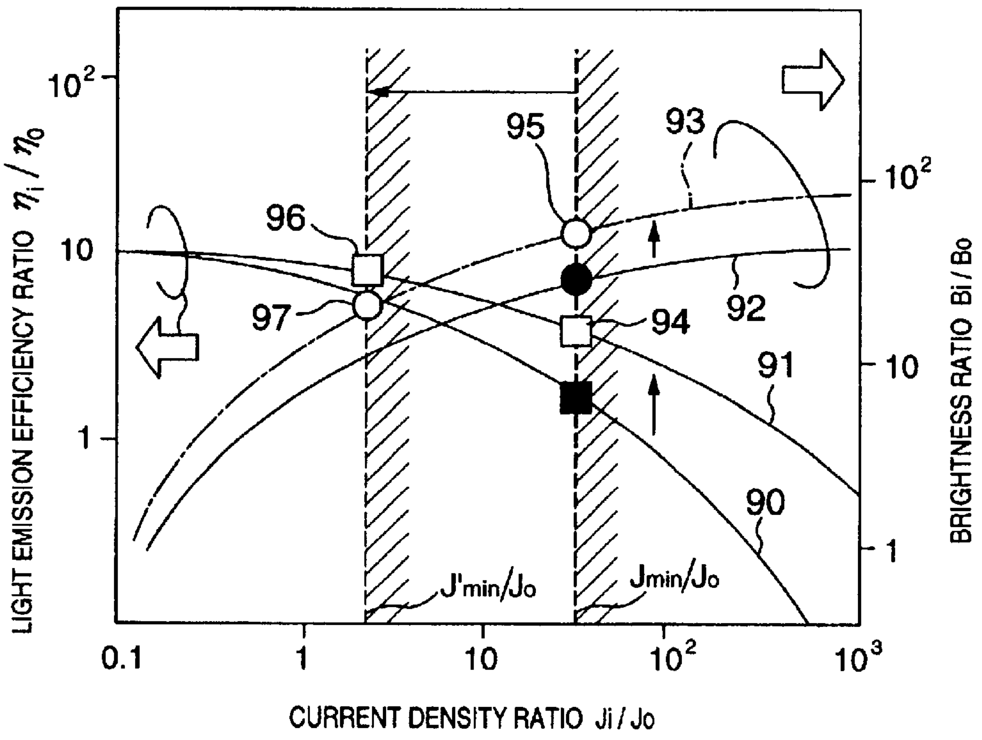
FIG. 25 is a characteristic diagram of a plasma display panel according to the invention.

FIG. 25 is a graph showing the relation between the current density ratio Ji/Jo and light emission efficiency ratio ηi/ηo, and the relation between the current density ratio Ji/Jo and brightness ratio Bi/Bo of the plasma display panel 1 according to one embodiment of the invention.

The abscissa is the current density ratio Ji/Jo, and the ordinate is the light emission efficiency ratio ηi/ηo and brightness ratio Bi/Bo. Each axis is graduated in logarithm scale. The light emission efficiency ratio ηi/ηo, and brightness ratio Bi/Bo are much increased from characteristic 90 to characteristic 91, and from characteristic 92 to characteristic 93, respectively by the embodiments of the invention shown in FIGS. 20 and 21.

Figure 22:
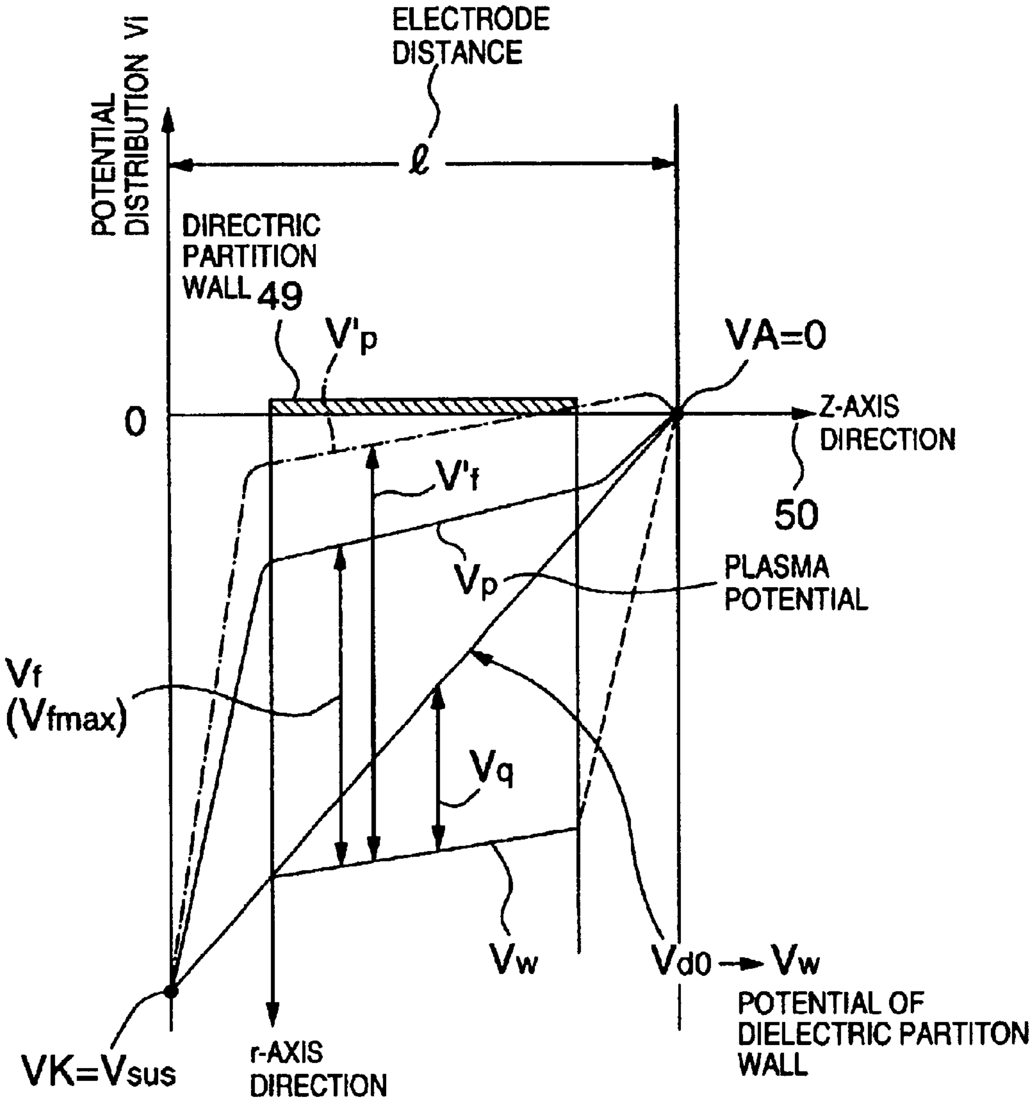
FIG. 22 is a diagram showing the potential distribution within the display cell of a plasma display panel according to the invention.
Figure 23:
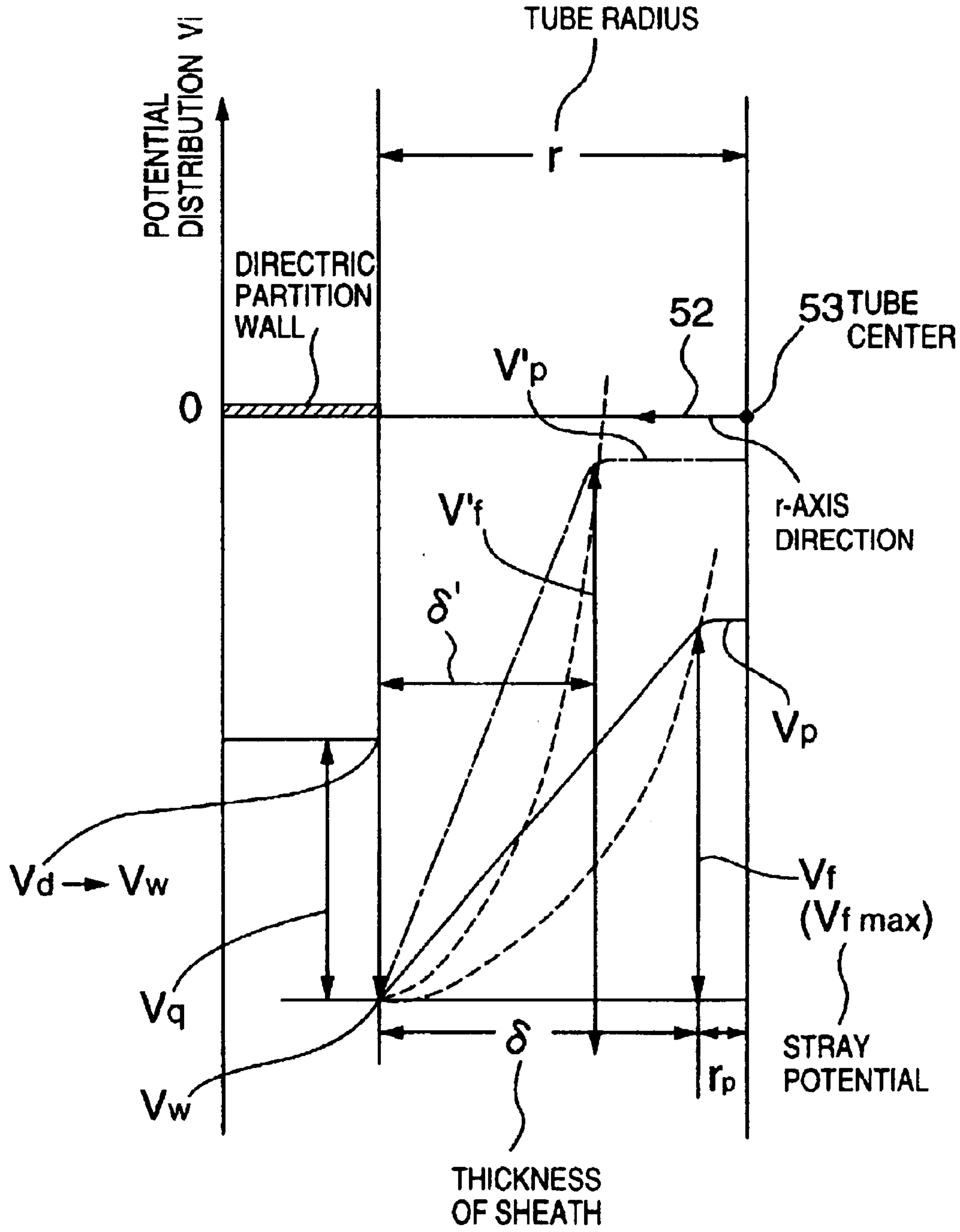
FIG. 23 is a diagram showing the potential distribution within the display cell of a plasma display panel according to the invention.

The characteristics 90, 92 are shown in FIGS. 22, 23. For fine display cells of about 0.03 cm in size, charged particles are easy to deposit on the partition wall surfaces (including the phosphor), and thus it is necessary to increase the current density (discharge maintaining current) in order to maintain the positive column. Thus, there is the minimum value Jmin/Jo. The black marks ■, and ● on the characteristic curves 90 and 92 indicate limited values for the use of dielectric partition walls. The brightness B and light emission efficiency η cannot coexist, and thus the light emission efficiency η is contrarily required to sacrifice in order to increase the brightness.

According to the invention, the electrode structure and field strength (potential) distribution are formed to satisfy the ruling conditions of the glow discharge characteristics mentioned above and to suppress the diffusion of charge to the partition walls. Thus, the characteristic curves 91, 93 can be obtained, and the current density can also be reduced by about one order of magnitude to reach a new minimum current density ratio J'min/Jo. Since the characteristic curves 91, 93 can be obtained, the light emission efficiency η and brightness B can be improved at a time as indicated by the white marks □ 94, ○ 95 on the characteristic curves 91, 93.

Moreover, as shown by the relation between the minimum values Jmin/jo and J'min/Jo, the light emission efficiency η can be simultaneously improved by decreasing the current density J, which fact has so far been difficult. At the new minimum value J'min/Jo, the brightness B can be reduced to some extent, and the light emission efficiency η can be much improved, as shown by the white marks □ 96, ○ 97 on the characteristics 91, 93. Thus, even if the sustaining pulse number is increased to raise the light emission duty, the consumption power is not increased so much, and hence the brightness B can be remarkably improved. In other words, the light emission efficiency and brightness can be much increased with ease as compared with the conventional ones.

As described above, according to the AC type plasma display panel of the present invention, the light emission efficiency and brightness are improved on the basis of the fundamental principle for effectively establishing a high field region and an equipotential region in the cathode dark space and positive column respectively, considering the maintaining conditions of glow discharge that uses the positive column, and for achieving low current and low voltage in the current voltage characteristic (I–V characteristic) of the cells.

(1) This principle can also be applied to the DC type plasma display panel. In addition, it can be applied to other electronic equipment for generating the positive column by glow discharge (for example, back light of liquid display) than the plasma display panel, and it can improve the discharge efficiency (ultraviolet light ray generation efficiency).

(2) A wall voltage is generated on the display electrode by AC type driving to achieve a low voltage mode in the I–V characteristic of cells, thus apparently reducing the cathode drop voltage Vc at the start of discharge to improve the discharge efficiency, or light emission efficiency.

(3) The partition walls can be constructed to have a high aspect ratio necessary for producing the positive column by the opposite electrodes and metal partition walls, thus increasing the opening rate and phosphor coating area to improve the light emission efficiency.

(4) A bias voltage is applied to the metal partition wall with the surface covered with an insulating layer, generating a negative wall voltage to suppress diffusion of charged particles to the partition walls (energy loss) and to improve the discharge efficiency and light emission efficiency.

(5) In addition, the discharge maintaining current is decreased by suppressing the diffusion to partition wall (energy loss) to expand the low current region of the I–V characteristic. Thus, discharge can be maintained stable in the low current region with no saturation of ultraviolet light ray by use of load straight lines (load resistance, current limiting resistance), and hence the discharge efficiency can be increased to the maximum, or the light emission efficiency can be maximized.

(6) If the metal partition wall is used as the anode relative to the anode and cathode electrodes at the time of display light emission discharge, the high field region in the cathode dark space and equipotential region in the positive column which are the conditions for maintaining glow discharge using the positive column can be effectively established, thus increasing the discharge efficiency, or light emission efficiency.

(7) Moreover, electron movement type memory discharge can be caused which fast generates negative wall voltage between the display electrodes having a long gap length by the AC type drive mode in which the metal partition wall is used as the anode electrode. The number of display light emission pulses is increased relative to a constant light emission duty, thereby increasing the brightness.

(8) When a DC bias voltage is applied to the metal partition wall as anode electrode, the wall voltage generated on the surface insulating layer of the metal partition wall is not extinguished or not required to be again produced at the time of repetitive light emission discharge. Thus, the discharge efficiency, or light emission efficiency can be improved.

(9) When the anode electrode and cathode electrode at the time of light emission are supplied with ground potential and negative voltage, respectively, the metal partition wall can be maintained at ground potential even if the display electrode potentials are exchanged. Thus, a ground plane can be formed within the panel, and the drive circuit for the metal partition walls can be removed. In other words, the panel can be constructed to be substantially of three electrode driving system.

(10) In addition, since the stray capacitance between the electrodes of panel is decreased by the gland plane within the panel, the ground potential and power supply potential can be stabilized to decrease the erroneous operation (improving the operation margin), and decrease the neighborhood magnetic and electric fields. Thus, unnecessary electromagnetic irradiation (EMI) can be suppressed.

(11) Since the cross electrode structure for address, Y can is constructed to form short gaps in a plane, and to reduce writing time (fast addressing), the display light emission duty can be increased to increase the brightness.

(12) The metal partition walls with the surface insulated are inserted between the opposite display electrodes having a long gap length, and minute space gaps (tens of microns) are formed therebetween, thereby concentrating the electric field to reduce the firing potential Vo.

(13) Since the contact area between the metal partition wall and the front plate and/or back plate is reduced by use of projections of dielectric post or the like, or the projections are provided not to intersect with the electrodes, the load capacitance between the display electrodes can be decreased so that the consumption power can be reduced.

(14) By the cross electrode structure of the back plate, it is possible that a dielectric layer is locally inserted in the cross portions between the electrodes to improve the dielectric strength and decrease the load capacitance without raising the firing potential Vo.

Figure 26:
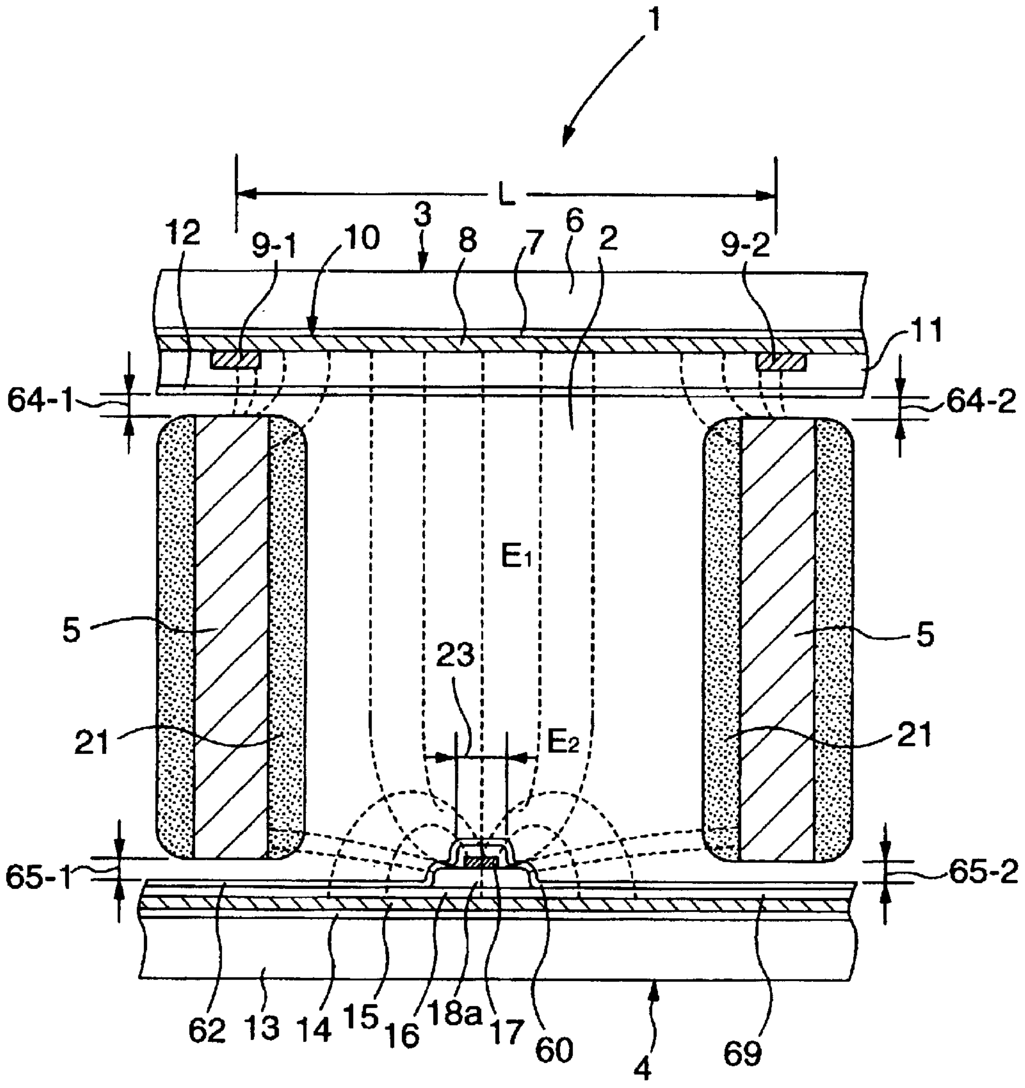
FIG. 26 is a cross-sectional view showing the display cell structure of a plasma display panel.

FIG. 26 shows the structure of the plasma display panel, 1. This panel is composed of front and back plates 3, 4 that have electrodes provided thereon to be connected to a drive circuit system, and partition walls 5 with the sides coated with a phosphor 21, and which are provided therebetween to form a plurality of display cells 2 surrounded by those components. One plane electrode is formed on the front plate 3 as a common display electrode 10 to the plurality of display cells. A display electrode group 17 and trigger electrode group 15 of a plurality of line-shaped electrodes are formed on the back plate 4 to intersect with each other. The intersection areas are located to face the display cells 2, or an opposite display/electrode type structure of panel is build up. This structure makes it possible to generate positive columns of discharge. In addition, since this structure is able to much increase the opening rate and phosphor coated areas of the display cells 2, the light emission efficiency and brightness can be increased at a time as compared with the AC type structure. The partition walls 5 are made of a dielectric material. Also, the one plane electrode formed as the common electrode 10 to the plurality of display cells 2 may be formed of a plurality of line-shaped electrodes, and the display electrode lines on both sides are arranged parallel from the standpoint of the stability of display light emission discharge.

There has found from our research that when the partition walls 5 in this plasma display panel are made of a dielectric material, the diffusion of charged particles to the partition walls 5, while the positive columns of discharge are being generated, leads to the reduction of discharge efficiency.

FIG. 22 shows the potential distribution Vi of the structure of FIG. 26 in the center axis (Z-axis) direction 50 of the display cell 2. This potential distribution is caused when display voltages VA (zero volt) and VK (a negative voltage Vsus) are respectively applied to a pair of display electrodes (X, Y electrodes) used as the anode electrode for one and the cathode electrode for the other. In FIG. 22, there are shown distribution curves of potential Vd on the dielectric partition wall before light emission discharge, potential Vw thereon immediately after light emission discharge, and plasma potential Vp within the cell space.

As illustrated, the potential Vdo of the dielectric partition wall before light emission discharge linearly changes from an anode potential VA of substantially zero volt to a cathode potential VK set at a negative display pulse voltage Vsus. When light emission discharge is caused under this condition, electrons are diffused to and deposited on the dielectric partition wall, thus changing the potential Vdo of the dielectric partition wall to a surface potential Vw of the dielectric partition walls after discharge. This is because when light emission discharge is caused, charged particles are diffused and deposited on the surface of the dielectric partition wall to make the dielectric partition wall surface take a substantially constant potential distribution, so that a negative wall voltage Vq is developed on the wall. The negative wall voltage Vq on the dielectric partition wall surface gives rise to excessive energy loss, thus reducing the discharge efficiency. The deposition of the charged particles on the dielectric partition wall is one of the factors to reduce the discharge efficiency.

The so-called ion sheath as shown in FIG. 23 is created to have a thickness $\delta$ between this plasma and the dielectric partition wall, and hence a stray potential Vf (Vfmax) proportional to electron temperature Te is induced between the plasma potential Vp and the surface potential Vw of the dielectric partition wall.

This stray potential Vf(Vfmax) is constant in the region (in the Z-axis direction) in which the positive column is generated because the electron temperature Te is substantially uniform. However, if the ionization energy is deficient due to the diffusion of charged particles to the partition walls to decrease the electron density ne, the stray potential Vf(Vfmax) cannot be sufficiently generated as will be understood from the equation (1) that is a newly derived expression. Or the thickness, δ of the ion sheath increases in order to maintain the stray potential Vf (Vfmax).

$$Vf \propto ne \cdot \delta^2 \quad (1)$$

When the thickness δ of the ion sheath increases to exceed the minimum cell size of the cell of a tube radius r or a rectangular shape, the radius $r_p$ of the plasma decreases as shown in FIG. 23 with the result that the plasma is difficult to rise. Thus, the glow discharge cannot be maintained stable. In this case, in order to stably maintain the glow discharge, it is necessary that the discharge maintaining current I (current density J) be increased to much increase the ionization energy and to increase the stray potential Vf' and electron density ne or the thickness δ' of the ion sheath be decreased to induce stable plasma potential Vp'. Thus, when dielectric partition walls are used, the improvement of the discharge efficiency is limited, and the light emission efficiency η is remarkably reduced because the discharge maintaining current increases even if the positive column can be generated in the glow discharge.

Thus, if the partition walls of the structure shown in FIG. 26 are made as metal partition walls, and if the bias voltage is applied thereto, the equipotential region substantially equal to the anode potential VA and the high field region are respectively established over all positive column and in the cathode dark space, which are the fundamental characteristics of glow discharge with the positive column produced as shown in FIGS. 20, 21. Accordingly, the stray potential Vf (Vfmax) and wall voltage Vq can be much decreased.

There is provided a plasma display panel of the opposite display electrode type in which a plurality of display cells are formed by the front and back plates having electrodes connected to a drive circuit system, and metal partition walls held therebetween and with the surfaces insulated, a single plane electrode is formed on the front plate as a common display electrode (which may be common display electrodes formed of a plurality of line shaped electrodes) to the plurality of display cells, and a display electrode group and trigger (address) electrode group formed by a plurality of line-shaped electrodes are provided on the back plate to intersect with each other so that the display cells can face the intersection areas. In this plasma display panel, glow discharge is generated by writing discharge between the display electrode group and the common display electrode within the display cell that is selected by the display electrode group and the trigger electrode group, the equipotential region is produced in the positive column region of the glow discharge by the metal potential Vm of the metal partition walls which is substantially equal to the anode potential Va, and the high field region is generated in the cathode dark space by this metal potential Vm and cathode potential VK.

(1) Generation of Equipotential Region in the Positive Column Region

As shown in FIGS. 20, 21, in order to generate the equipotential region having a constant metal potential Vm by using the metal partition walls 5, and make it substantially equal to the plasma potential Vp of the positive column region, we use the fact that the plasma potential Vp of the positive column stably generated by the glow discharge characteristic substantially equals to the anode potential VA. Either one of the display electrode group and the common display electrode and the other one are selected as the anode electrode, and as the cathode electrode, and the display pulse voltage VA applied to the anode electrode, of the two display pulse voltages VA, VK, is made substantially equal to the metal potential Vm, thereby producing the necessary equipotential region. During this operation, since a negative pulse voltage is applied only to the cathode electrode, and since the metal partition walls and the anode electrode are grounded, the metal partition walls are maintained at the anode electrode, or ground potential (DC bias potential) even if the opposite display electrodes are exchanged or if the anode electrode and cathode electrode are exchanged because of the AC type. Therefore, the metal partition walls arranged within the panel form an effective ground plane, thus remarkably reducing the effect of the stray capacitance between the electrodes and between the wiring conductors because the metal partition walls are disposed very close to the display electrodes, common display electrodes and address electrodes.

The metal potential Vm is applied by two means, or by use of external potential (for example, ground potential), and stray capacitance potential.

The external potential for metal potential Vm is excellent in stability, but affected by the DC component of the drive waveforms to be applied to the X, Y electrodes. In order to avoid this, the DC voltage components generated are made equal to the external potential.

The stray capacitance potential for the metal potential Vm of metal partition walls 5 can be set according to the ratio between the capacitance distributions that are present between the metal partition wall and opposite electrodes formed over all the panel [the ratio between two capacitances, or the capacitance between the common display electrode (X electrode) and the metal partition wall electrode (M electrode), and the capacitance between the display electrode group (Y electrode group) and the metal partition wall electrode (M electrode)], and to the difference (the difference between two components, X and Y) between the DC voltage components of drive waveforms applied between the opposite display electrodes. For example, even if there is a difference between the two capacitances, the two DC voltages are made equal so that the metal potential Vm can be set to be a DC voltage component.

In addition, the absolute value of the metal potential Vm should be given by the external potential (ground potential, DC bias potential, or other potential) considering the stray capacitance potential or reversely given, or set to be substantially zero volt (within about ±30v) considering the effect of the driving system, and DC voltage components of drive waveforms (sub-field unit or 1 TV field unit), and the improvement of stability of voltage operation margin.

Thus, the display pulse voltage VA applied to the anode electrode and the metal potential Vm can be made substantially zero volt, and also the display pulse voltage VK applied to the cathode electrode can be set to be the negative display pulse voltage Vsus.

When the amount of unnecessary discharge current flowing to the metal partition walls 5 is limited by use of ground potential, the metal partition walls 5 are constructed to have a high impedance (high resistance) against the anode electrode or cathode electrode or the metal partition walls 5 are grounded through a much higher resistance than the load resistance of both display electrodes.

Moreover, when the metal potential Vm is set to be an arbitrary value, it is given by both the external potential and the stray capacitance potential, and both potentials are made substantially equal. Thus, the effect of the DC voltage components can be fully removed, and the stability to the voltage operation margin (the stability of the X, Y electrode potential) can be improved.

(2) Establishment of High Field Region Into Cathode Dark Space

A high field region is produced into the cathode dark space by much reducing (about tens of microns) the gap distance between the metal partition wall 5 and the cathode electrode to which the display pulse voltage VK is applied (air gaps 64, 65, 67, 68 shown in FIGS. 15 and 16). In other words, air gaps are made up between the metal partition wall 5 and the front plate 3 or back plate 4 having electrodes by providing metal or dielectric recesses or projections on either structure (metal partition walls or front plate 3, back plate 4).

Thus, the display pulse voltage VA applied to the anode electrode can be made substantially equal to the metal potential Vm, and almost all the potential difference (VA–VK) between the display pulse voltages applied to the anode electrode and cathode electrode is applied across the air gap between the metal partition wall 5 and the cathode electrode, generating a high field region.

If this air gap is further provided at around the intersection areas between the metal partition wall 5 and the display electrode (group) 17 or between the metal partition wall 5 and the common display electrode 10, away from the structure of display cells 2, a low field region can be established at the center of the cell interior separated from this intersection area. In other words, a necessary and appropriate high electric field region is established in the cathode dark space around the air gaps 65, 68 by self-balance.

What is claimed is:

1. A plasma display panel comprising:

a front plate;

at least one electrode disposed on the front plate;

a back plate opposing the front plate, the back plate being spaced apart from the front plate;

at least one electrode disposed on the back plate; and a plurality of partition walls each having a structure of forming a dielectric layer on a metal disposed between the front plate and the back plate, the partition walls dividing a space between the front plate and the back plate into a plurality of display cells;

wherein each of the partition walls has a plurality of projections opposing one of the front plate and the back plate; and wherein the projections are arranged such that the projections do not overlap the at least one electrode disposed on the one of the front plate and the back plate.

2. A plasma display panel according to claim 1, wherein the front plate has one plane electrode formed as a common display electrode for the plurality of display cells.

3. A plasma display panel according to claim 2, wherein the plane electrode has openings which do not overlap the projections on the partition wall.

4. A plasma display panel according to claim 1, wherein the projections formed on the partition wall are made of at least one of a dielectric material and a material of the partition wall.

5. A plasma display panel according to claim 1, wherein the partition wall is a metal partition wall having an insulating layer formed on a surface of the metal partition wall;

wherein a first electrode on the front plate, a second electrode on the back plate, and the metal partition wall are connected to a drive circuit system; and wherein a current limiting resistance is connected between the drive circuit system and the first electrode on front plate, the second electrode on the back plate, and the metal partition wall.

6. A plasma display panel according to claim 5, wherein the current limiting resistance has a value which enables a discharge maintaining current to flow between the first electrode and the second electrode.

7. A plasma display panel according to claim 1, wherein the back plate has a plurality of address electrodes and a plurality of first display electrodes arranged to intersect the address electrodes; and wherein the front plate has a plurality of second display electrodes arranged to oppose the plurality of first display electrodes.

8. A plasma display panel according to claim 1, wherein the partition wall is a metal partition wall having an insulated wall surface.

9. A plasma display panel according to claim 8, wherein the partition wall is formed by stacking metal layers each having a dielectric layer on a surface of the metal layer.

10. A plasma display panel according to 9, wherein at least one of the metal layers does not have a bias voltage applied thereto.

11. A plasma display panel according to claim 1, wherein the front plate and the back plate are connected to a drive circuit system; and wherein a voltage of the partition wall is set to substantially zero volts.

12. A plasma display panel according to claim 1, wherein the front plate and the back plate are connected to a drive circuit system; and wherein a voltage of the partition wall is set to a voltage in a range of −30 to +30 volts.

13. A plasma display panel according to claim 1, wherein the front plate and the back plate are connected to a drive circuit system; and wherein the partition wall serves as an anode electrode.

14. A plasma display panel according to claim 1, wherein an electrode on one of the front plate and the back plate serves as an anode electrode, and an electrode on the other one of the front plate and the back plate serves as a cathode electrode; and wherein a voltage of the partition wall is substantially equal to a voltage of the anode electrode.

15. A plasma display panel according to claim 1, wherein an electrode on one of the front plate and the back plate serves as an anode electrode, and an electrode on the other one of the front plate and the back plate serves as a cathode electrode;

wherein the partition wall and the anode electrode are grounded; and wherein the cathode electrode has a negative voltage applied thereto.

16. A plasma display panel according to claim 1, wherein the partition wall has an external voltage applied thereto.

17. A plasma display panel according to claim 1, wherein the partition wall has a potential which is provided by a capacitance distribution formed by a first electrode on the back plate, a second electrode on the front plate, and the partition wall, and a stray capacitance potential caused by a direct-current voltage component of a drive waveform applied to the first electrode and the second electrode.

18. A plasma display panel according to claim 1, wherein at least some of the at least one electrode on the front plate and at least some of the at least one electrode on the back plate cause a main positive column glow discharge in the display cells when a drive circuit system applies a voltage between the at least some of the at least one electrode on the front plate and the at least some of the at least one electrode on the back plate.

19. A plasma display panel comprising:

a plurality of display cells surrounded by a front plate and a back plate both having electrodes, and partition walls each having a structure of forming a dielectric layer on a metal, disposed between the front plate and the back plate;

wherein at least one of the front plate and the back plate has a plurality of projections opposing the partition walls; and wherein the projections are arranged such that the projections do not overlap the electrodes on the at least one of the front plate and the back plate.

20. A plasma display panel according to claim 19, wherein the front plate has one plane electrode formed as a common display electrode for the plurality of display cells.

21. A plasma display panel according to claim 20, wherein the front plate has a plurality of projections opposing the partition walls; and wherein the plane electrode has openings which do not overlap the projections on the front plate.

22. A plasma display panel according to claim 19, wherein the projections on the at least one of the front plate and the back plate are formed on a portion of a surface of the at least one of the front plate and the back plate opposing the partition walls.

23. A plasma display panel according to claim 19, wherein the projections on the at least one of the front plate and the back plate are formed of a dielectric material.

24. A plasma display panel according to claim 19, wherein at least some of the at least one electrode on the front plate and at least some of the at least one electrode on the back plate cause a main positive column glow discharge in the display cells when a drive circuit system applies a voltage between the at least some of the at least one electrode on the front plate and the at least some of the at least one electrode on the back plate.

25. A plasma display panel according to claim 1, wherein the projections do not overlap total electrodes disposed on the at least one of the front plate and back plate which is arranged on a side where the projections are protruded.

26. A plasma display panel according to claim 19, wherein the projections do not overlap the electrodes on the at least one of the front plate and the back plate in a direction toward the projections.

27. A plasma display panel according to claim 1, wherein the projections are provided on the partition wall in a longitudinal direction of the partition wall to become protruded on the wall.

28. A plasma display panel according to claim 1, wherein the projections are provided on the partition wall in a transverse direction of the partition wall to become protruded on the wall.

29. A plasma display panel according to claim 1, wherein the projections do not overlap X-electrodes in a case of providing the projections on the side of the front plate.

30. A plasma display panel according to claim 1, wherein the projections do not overlap address electrodes and Y-electrodes in a case of providing the projections on the side of the back plate.

31. A plasma display panel according to claim 1, wherein the projections do not overlap X-electrodes in a case of providing the projections on both the sides of the front plate and the back plate.

32. A plasma display panel according to claim 1, wherein the projections do not overlap address electrodes and Y-electrodes in a case of providing the projections on both the side of the front plate and the back plate.

* * * * *